US008993126B2

(12) United States Patent
Nowatari et al.

(10) Patent No.: US 8,993,126 B2
(45) Date of Patent: Mar. 31, 2015

(54) LIGHT-EMITTING ELEMENT INCLUDING A LAYER HAVING A CONCENTRATION GRADIENT, LIGHT-EMITTING DEVICE, DISPLAY, AND ELECTRONIC DEVICE

(75) Inventors: Hiromi Nowatari, Kanagawa (JP); Satoshi Seo, Kanagawa (JP); Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 328 days.

(21) Appl. No.: 13/166,398

(22) Filed: Jun. 22, 2011

(65) Prior Publication Data
US 2011/0315968 A1 Dec. 29, 2011

(30) Foreign Application Priority Data

Jun. 25, 2010 (JP) ................................. 2010-144697

(51) Int. Cl.
H01L 51/54 (2006.01)
H01L 51/52 (2006.01)
H01L 51/00 (2006.01)
H01L 51/50 (2006.01)
H01L 27/32 (2006.01)

(52) U.S. Cl.
CPC ........ *H01L 51/5278* (2013.01); *H01L 51/0078* (2013.01); *H01L 51/5052* (2013.01); *H01L 27/3244* (2013.01); *H01L 51/0059* (2013.01); *H01L 51/0072* (2013.01); *H01L 51/0074* (2013.01); *H01L 51/0081* (2013.01); *H01L 51/0085* (2013.01); *H01L 51/5004* (2013.01); *H01L 2251/5346* (2013.01); *Y10S 428/917* (2013.01)
USPC ........... 428/690; 428/917; 313/504; 313/506; 257/40; 257/E51.026

(58) Field of Classification Search
None
See application file for complete search history.

(56) References Cited

U.S. PATENT DOCUMENTS

| | | | |
|---|---|---|---|
| 5,998,803 | A | 12/1999 | Forrest et al. |
| 6,013,384 | A | 1/2000 | Kido et al. |
| 7,192,659 | B2 | 3/2007 | Ricks et al. |
| 7,462,883 | B2 | 12/2008 | Kumaki et al. |
| 7,494,722 | B2 | 2/2009 | Liao et al. |
| 7,560,862 | B2 | 7/2009 | Liao et al. |
| 7,960,723 | B2 | 6/2011 | Buechel |
| 2002/0180347 | A1 | 12/2002 | Adachi et al. |
| 2003/0127967 | A1 | 7/2003 | Tsutsui et al. |
| 2003/0189401 | A1 | 10/2003 | Kido et al. |
| 2004/0227460 | A1 | 11/2004 | Liao et al. |
| 2005/0098207 | A1 | 5/2005 | Matsumoto et al. |
| 2005/0104511 | A1 | 5/2005 | Liao et al. |
| 2006/0008740 | A1 | 1/2006 | Kido et al. |
| 2006/0087225 | A1 | 4/2006 | Liao et al. |
| 2006/0188745 | A1 | 8/2006 | Liao et al. |
| 2006/0220534 | A1 | 10/2006 | Shibanuma et al. |
| 2006/0292394 | A1 | 12/2006 | Iwaki et al. |
| 2007/0001570 | A1 | 1/2007 | Nomura et al. |
| 2007/0040161 | A1 | 2/2007 | Kumaki et al. |
| 2007/0090376 | A1 | 4/2007 | Kumaki et al. |
| 2007/0114512 | A1 | 5/2007 | Kumaki et al. |
| 2007/0114527 | A1 | 5/2007 | Kumaki et al. |
| 2007/0120136 | A1 | 5/2007 | Noda et al. |
| 2007/0182317 | A1 | 8/2007 | Kido et al. |
| 2007/0200125 | A1 | 8/2007 | Ikeda et al. |
| 2007/0210322 | A1* | 9/2007 | Ohsawa et al. ................. 257/79 |
| 2008/0135858 | A1 | 6/2008 | Yamazaki et al. |
| 2008/0278064 | A1 | 11/2008 | Kumaki et al. |
| 2009/0102366 | A1 | 4/2009 | Ushikubo et al. |
| 2009/0167158 | A1 | 7/2009 | Kathirgamanathan et al. |
| 2009/0167168 | A1 | 7/2009 | Seo et al. |
| 2009/0284138 | A1* | 11/2009 | Yasukawa et al. ............ 313/504 |
| 2009/0321722 | A1 | 12/2009 | Buechel |
| 2010/0096622 | A1 | 4/2010 | Iizumi et al. |
| 2010/0133523 | A1 | 6/2010 | Nowatari et al. |
| 2010/0133573 | A1* | 6/2010 | Nowatari et al. ............... 257/98 |
| 2010/0301316 | A1 | 12/2010 | Nowatari et al. |
| 2010/0301317 | A1 | 12/2010 | Nowatari et al. |
| 2011/0057179 | A1 | 3/2011 | Nowatari et al. |
| 2011/0215307 | A1 | 9/2011 | Nowatari et al. |
| 2011/0233530 | A1 | 9/2011 | Nowatari et al. |
| 2011/0240971 | A1 | 10/2011 | Nowatari et al. |
| 2011/0240972 | A1 | 10/2011 | Nowatari et al. |

FOREIGN PATENT DOCUMENTS

CN 101490867 A 7/2009
CN 101611505 A 12/2009
(Continued)

OTHER PUBLICATIONS

International Search Report re application No. PCT/JP2011/063194, dated Sep. 13, 2011.
Written Opinion re application No. PCT/JP2011/063194, dated Sep. 13, 2011.
Liao, L.S. et al., "High-Efficiency Tandem Organic Light-Emitting Diodes," Applied Physics Letters, vol. 84, No. 2, Jan. 12, 2004, pp. 167-169.
Tsutsui, T. et al., "Electric Field-Assisted Bipolar Charge Spouting in Organic Thin-Film Diiodes," Applied Physics Letters, vol. 84, No. 3, Jan. 19, 2004, pp. 440-442.

(Continued)

*Primary Examiner* — Andrew K Bohaty
(74) *Attorney, Agent, or Firm* — Husch Blackwell LLP

(57) ABSTRACT

In the light-emitting element in which a plurality of EL layers is separated from each other by a charge generation layer, provided are an electron relay layer in contact with an anode side of the charge generation region and an electron transport layer in contact with the electron relay layer. The electron transport layer contains an alkaline earth metal. A concentration gradient of the alkaline earth metal contained in the electron transport layer is such that the concentration of the alkaline earth metal becomes lower from an interface between the electron transport layer and the electron relay layer to the anode.

35 Claims, 19 Drawing Sheets

(56) References Cited

FOREIGN PATENT DOCUMENTS

| EP | 2 117 063 A1 | 11/2009 |
|---|---|---|
| JP | 10-270171 A | 10/1998 |
| JP | 2003-272860 A | 9/2003 |
| JP | 2005-209643 A | 8/2005 |
| JP | 2006-351398 | 12/2006 |
| JP | 2008-218396 | 9/2008 |
| JP | 2010-514092 | 4/2010 |
| KR | 10-2009-0034986 | 4/2009 |
| KR | 10-2009-0121317 | 11/2009 |
| WO | WO 01/15244 A1 | 3/2001 |
| WO | WO 2007/130047 A1 | 11/2007 |
| WO | WO 2008/010161 A2 | 1/2008 |
| WO | WO 2008/102644 A1 | 8/2008 |

OTHER PUBLICATIONS

Ikeda, H. et al., "P-185: Low-Drive-Voltage OLEDs With a Buffer Layer Having Molybdenum Oxide," SID Digest '06 : SID International Symposium Digest of Technical Papers, vol. 37, 2006, pp. 923-926.

Birnstock, J. et al., "54.3: Distinguished Paper: White Stacked OLED With 35 lm/W and 100,000 Hours Lifetime at 1000 cd/m2 for Display and Lighting Applications," SID Digest '08 : SID International Symposium Digest of Technical Papers, vol. 39, May 20, 2008, pp. 822-825.

Kanno, H. et al., "High Efficiency Stacked Organic Light-Emitting Diodes Employing Li2O as a Connecting Layer," Japanese Journal of Applied Physics, vol. 45, No. 12, Dec. 7, 2006, pp. 9219-9223.

Nowatari, H. et al., "60.2: Intermediate Connector With Suppressed Voltage Loss for White Tandem OLEDs," SID Digest '09 : SID International Symposium Degest of Technical Papers, vol. 40, May 31, 2009, pp. 899-902.

Chang, C.-C. et al., "Highly Efficient White Organic Electroluminescent Devices Based on Tandem Architecture," Applied Physics Letters, vol. 87, No. 25, Dec. 12, 2005, pp. 253501-1-253501-3.

Kanno, H. et al., "White Stacked Electrophosphorescent Organic Light-Emitting Devices Employing MoO3 as a Charge-Generation Layer," Advanced Materials, vol. 18, No. 3, 2006, pp. 339-342.

Terai, M. et al., "Electric-Field-Assisted Bipolar Charge Generation From Internal Charge Separation Zone Composed of Doped Organic Bilayer," Applied Physics Letters, vol. 90, Feb. 21, 2007, pp. 083502-1-083502-3.

Law, C.W. et al., "Effective Organic-Based Connection Unit for Stacked Organic Light-Emitting Devices," Applied Physics Letters, vol. 89, No. 13, Sep. 28, 2006, pp. 133511-1-133511-3.

Leem, D.-S. et al., "Highly Efficient Tandem p-i-n Organic Light-Emitting Diodes Adopting a Low Temperature Evaporated Rhenium Oxide Intercorporating Layer," Applied Physics Letters, vol. 93, No. 10, Sep. 8, 2008, pp. 103304-1-103304-3.

Lai, S.L. et al., "Copper Hexadecafluorophthalocyanine and Copper Phthalocyanine as a Pure Organic Connecting Unit in Blue Tandem Organic Light-Emitting Devices," Journal of Applied Physics, vol. 101, 2007, pp. 014509-1-014509-4.

Liao, L.S. et al., "Power Efficiency Improvement in a Tandem Organic Light-Emitting Diode," Applied Physics Letters, vol. 93, No. 22, Jun. 2, 2008, pp. 223311-1-223311-3.

Chan, M-Y. et al., "Influences of Connecting Unit Architecture on the Performance of Tandem Organic Light-Emitting Devices," Advanced Functional Materials, vol. 17, No. 14, 2007, pp. 2509-2514.

Hiramoto, M. et al., "p-i-n Like Behavior in Three-Layered Organic Solar Cells Having a Co-Deposited Interlayer of Pigments," Journal of Applied Physics, vol. 72, No. 8, Oct. 15, 1992, pp. 3781-3787.

Brabec, C.J. et al., "Photovoltaic Properties of Conjugated Polymer/methanofullerene Composites Embedded in a Polystyrene Matrix," Journal of Applied Physics, vol. 85, No. 9, May 1, 1999, pp. 6866-6872.

Matsumoto, T. et al., "27.5L: Late-News Paper: Multiphoton Organic EL Device Having Charge Generation Layer," SID Digest '03 : SID International Symposium Digest of Technical Papers, vol. 34, 2003, pp. 979-981.

\* cited by examiner

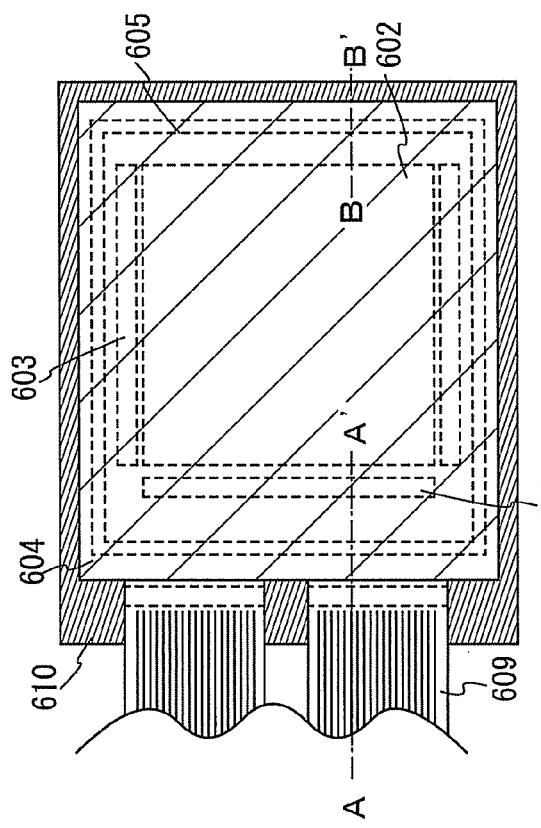
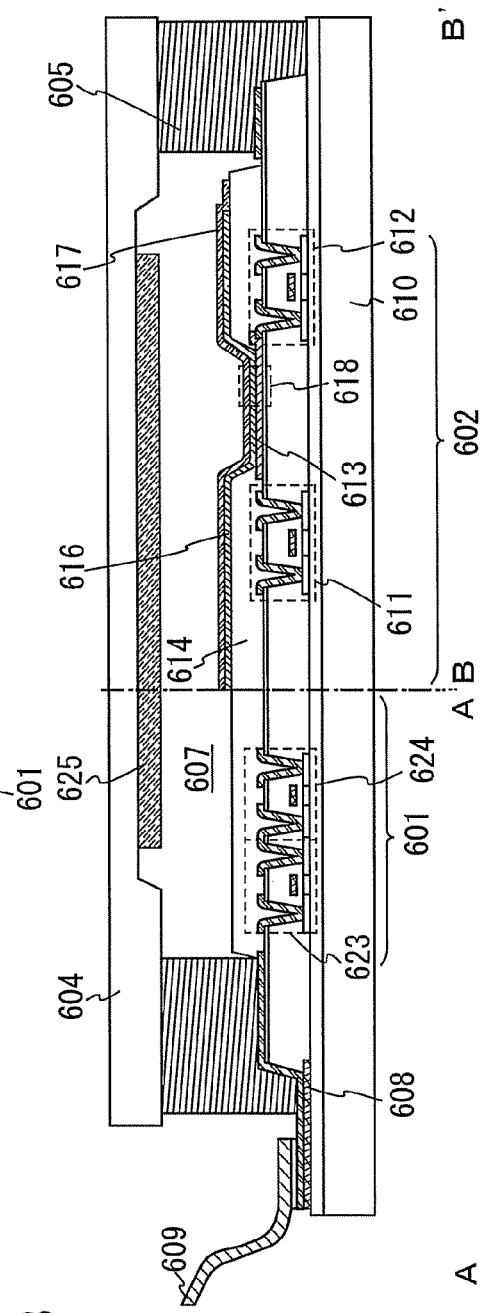
FIG. 3A
FIG. 3B

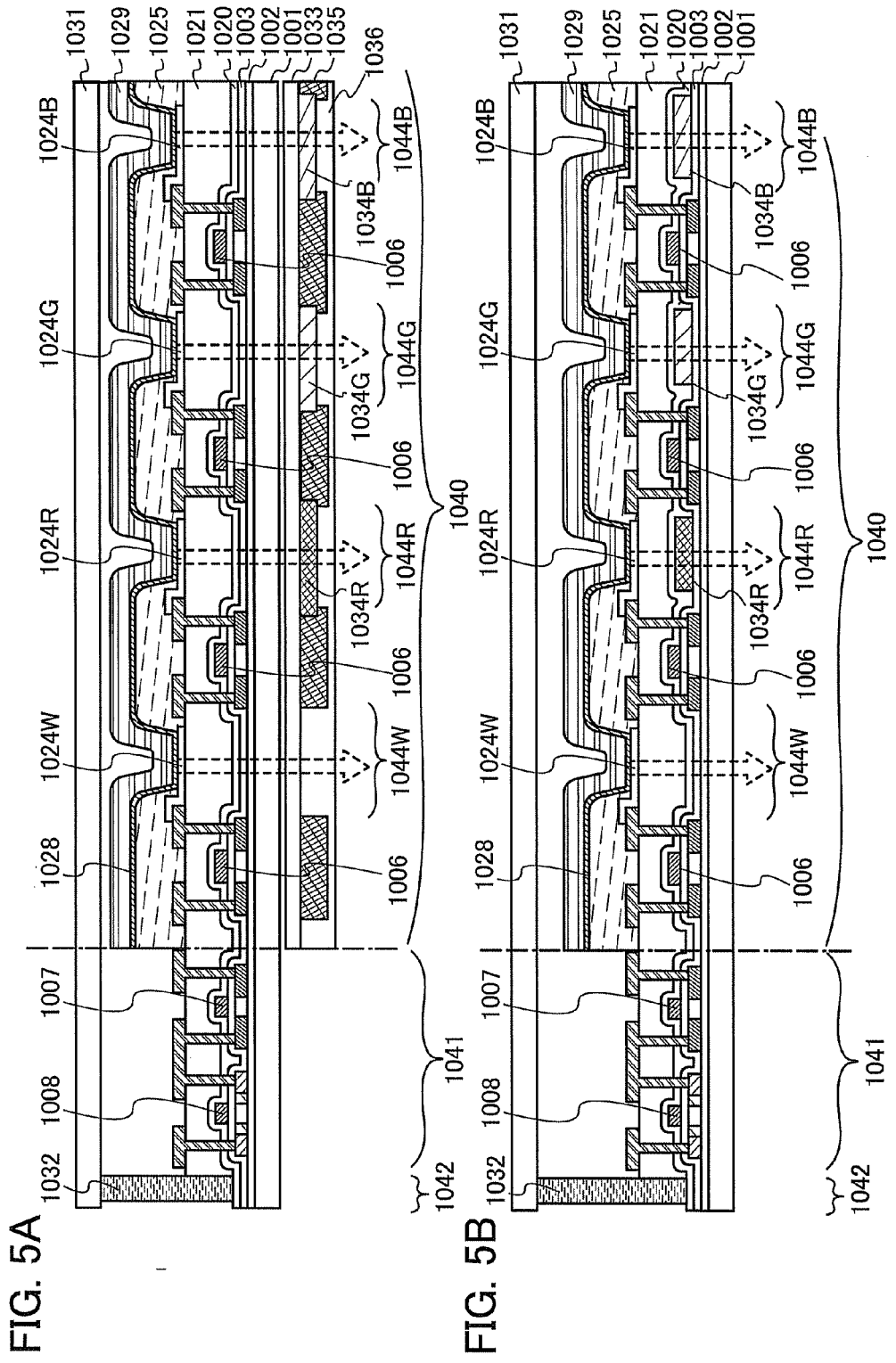

blue display region ←→ non-display region
boundary non-display region ←→ red display region
boundary

LIGHT-EMITTING ELEMENT INCLUDING A LAYER HAVING A CONCENTRATION GRADIENT, LIGHT-EMITTING DEVICE, DISPLAY, AND ELECTRONIC DEVICE

TECHNICAL FIELD

The present invention relates to a light-emitting element which includes a light-emitting layer containing an organic compound between a pair of electrodes. Further, the present invention relates to a light-emitting device including the light-emitting element and an electronic device including the light-emitting device.

BACKGROUND ART

In recent years, mobile devices show remarkable development, and one can easily enjoy image works anytime and anywhere with a small image reproducing device, a display attached to a mobile phone, and the like. Further, image data is being more often downloaded or transferred by a small memory, and the demand for the mobile devices is expected to increase.

In order to enjoy high-quality image works with a small display such as a display attached to a mobile phone, the display is required to have sufficiently high definition.

Meanwhile, a light-emitting element (also referred to as an electroluminescence element or an EL element) which includes a light-emitting layer containing an organic compound between a pair of electrodes is capable of high-speed response and DC drive at low voltage, and can be manufactured to be thin and lightweight. Therefore, the light-emitting element is putting into practical use as a flat panel display element and a mobile display element.

An EL element includes a pair of electrodes and an EL layer containing a light-emitting substance, which is provided between the electrodes, and emits light when the light-emitting substance contained in the EL layer is excited by current flowing through the EL layer. Therefore, in order to obtain high light emission intensity of such an EL element, a corresponding amount of current needs to flow through the light-emitting layer, and power consumption is increased accordingly. Further, as large current flows, degradation of an EL element is accelerated.

In view of the above, a light-emitting element which includes a stack of a plurality of EL layers and thereby capable of emitting light with high luminance as compared to a light-emitting element including only one EL layer, when current having the same current density flows through each light-emitting element, is proposed (e.g., see Patent Document 1). In the light-emitting element disclosed in Patent Document 1, a plurality of light-emitting units (EL layers) is separated from each other by a charge generation layer.

REFERENCE

Patent Document

[Patent Document 1] Japanese Published Patent Application No. 2003-272860

DISCLOSURE OF INVENTION

In the case of manufacturing a high-definition display, problems which do not occur in lighting application and a display having a large pixel size are caused in some cases. One of such problems is an interference phenomenon between adjacent pixels, that is, crosstalk.

In the light-emitting element disclosed in Patent Document 1, in which EL layers are stacked and separated from each other by a charge generation layer, an electron injection buffer layer is provided together with the charge generation layer as an intermediate layer in many cases in order to easily inject electrons generated in the charge generation layer to the EL layer and to reduce driving voltage. In particular, when a high-definition monochrome display or a high-definition display achieving full color display using a color filter or a color conversion layer is manufactured using such a light-emitting element, there is a problem in that crosstalk easily occurs because a plurality of light-emitting elements shares one intermediate layer.

Detailed description is provided with reference to FIGS. 1A and 1B. FIGS. 1A and 1B illustrate, as an example, three adjacent pixels (a pixel 1, a pixel 2, and a pixel 3) in a light-emitting device which is manufactured using a plurality of elements in each of which two EL layers (a first EL layer 12a and a second EL layer 12b) are stacked and separated from each other by an intermediate layer 13. The intermediate layer 13 is a layer including at least a charge generation layer and an electron injection buffer layer. In each pixel, these EL layers (the first EL layer 12a and the second EL layer 12b) and the intermediate layer 13 are provided between an anode 10 (an anode 10-1 of the pixel 1, an anode 10-2 of the pixel 2, or an anode 10-3 of the pixel 3) and a cathode 11. The EL layers (the first EL layer 12a and the second EL layer 12b), the intermediate layer 13, and the cathode 11 are common among a plurality of light-emitting elements. When the pixel 2 is selected, voltage is applied between the anode 10-2 and the cathode 11, current flows between the anode 10-2 and the cathode 11, and thus light emission can be obtained from the first EL layer 12a-2 and the second EL layer 12b-2 in the pixel 2. In the case of a light-emitting device having a large pixel size, even when conductivity of the intermediate layer 13 is high to some extent, current in a lateral direction is sufficiently reduced because of a long distance between pixels, and thus, crosstalk is unlikely to occur (FIG. 1A). On the other hand, in the case of a high-definition light-emitting device, a distance between pixels becomes shorter as definition of the device is increased; therefore, current flowing in a lateral direction through the intermediate layer causes light emission in the second EL layer 12b in the pixel 1 and the pixel 3 (the second EL layer 12b-1 and the second EL layer 12b-3), which are not selected, resulting in crosstalk (FIG. 1B).

However, when the intermediate layer 13 is formed using a material having conductivity low enough to suppress crosstalk in a high-definition light-emitting device, driving voltage of the light-emitting element might be greatly increased.

Thus, in one embodiment of the present invention, in a light-emitting element having a structure in which EL layers are stacked and separated from each other by a charge generation layer, an object is to provide a light-emitting element capable of suppressing crosstalk between adjacent pixels without great increase in driving voltage even in the case where the light-emitting element is used in a high-definition display. Note that the light-emitting element having a structure in which EL layers are stacked and separated from each other by a charge generation layer is a light-emitting element which has high emission efficiency and is capable of emitting light with high luminance.

Further, in one embodiment of the present invention, an object is to provide a high-definition light-emitting device in which crosstalk between adjacent pixels is suppressed without great increase in driving voltage. Furthermore, an object is to provide a light-emitting device or a display which has small power consumption, high reliability, and high display quality.

In one embodiment of the present invention, another object is to provide a light-emitting device with high display quality. Still another object is to provide a display with high display quality. Still another object is to provide an electronic device including a display portion with high display quality.

The present invention aims to achieve at least one of the above-described objects.

The present inventors have found that in the light-emitting element in which a plurality of EL layers is separated from each other by a charge generation region, a structure can achieve the above objects, in which an electron relay layer provided in contact with an anode side of the charge generation region and an electron transport layer provided in contact with the electron relay layer are included, the electron transport layer contains an alkaline earth metal, and a concentration gradient of the alkaline earth metal contained in the electron transport layer is such that the concentration of the alkaline earth metal becomes lower from an interface between the electron transport layer and the electron relay layer to the anode.

In other words, one embodiment of the present invention is a light-emitting element including n EL layers (n is a natural number greater than or equal to 2) between an anode and a cathode, and a first layer and a second layer between the m-th EL (m is a natural number, 1≤m≤n−1) layer and the (m+1)-th EL layer from the anode. The first layer is provided between and in contact with the (m+1)-th EL layer and the second layer. The second layer is provided between and in contact with the first layer and the m-th EL layer. The m-th EL layer includes at least a light-emitting layer and an electron transport layer in contact with the second layer. The first layer contains a first substance having a hole transport property and an acceptor substance with respect to the first substance having a hole transport property. The second layer contains a second substance having an electron transport property. The electron transport layer contains a third substance having an electron transport property and an alkaline earth metal. In the electron transport layer, a concentration gradient of the alkaline earth metal is such that the concentration of the alkaline earth metal becomes lower from an interface with the second layer to the anode.

Further, another embodiment of the present invention is a light-emitting element including n EL layers (n is a natural number greater than or equal to 2) between an anode and a cathode, and a first layer and a second layer between the m-th EL layer (m is a natural number, 1≤m≤n−1) and the (m+1)-th EL layer from the anode. The first layer is provided between and in contact with the (m+1)-th EL layer and the second layer. The second layer is provided between and in contact with the first layer and the m-th EL layer. The m-th EL layer includes at least a light-emitting layer and an electron transport layer in contact with the second layer. The first layer contains a first substance having a hole transport property and an acceptor substance with respect to the first substance having a hole transport property. The second layer contains a second substance having an electron transport property and a donor substance with respect to the second substance having an electron transport property. The electron transport layer contains a third substance having an electron transport property and an alkaline earth metal. In the electron transport layer, a concentration gradient of the alkaline earth metal is such that the concentration of the alkaline earth metal becomes lower from an interface with the second layer to the anode.

Another embodiment of the present invention is a light-emitting element having the above structure, in which the donor substance is an alkali metal, an alkaline earth metal, a rare earth metal, an alkali metal compound, an alkaline earth metal compound, or a rare earth metal compound. Another embodiment of the present invention is a light-emitting element having the above structure, in which the second layer has a thickness of greater than or equal to 1 nm and less than or equal to 10 nm.

Another embodiment of the present invention is a light-emitting element having the above structure, in which the second layer contains the donor substance so that the mass ratio of the donor substance to the second substance is grater than or equal to 0.001:1 and less than or equal to 0.1:1.

Another embodiment of the present invention is a light-emitting element having the above structure, in which the LUMO level of the second substance is greater than or equal to −5.0 eV and less than or equal to −3.0 eV.

Another embodiment of the present invention is a light-emitting element having the above structure, in which the second substance is a perylene derivative or a nitrogen-containing condensed aromatic compound.

Another embodiment of the present invention is a light-emitting element having the above structure, in which the second substance is any of phthalocyanine-based materials represented by the following structural formulae.

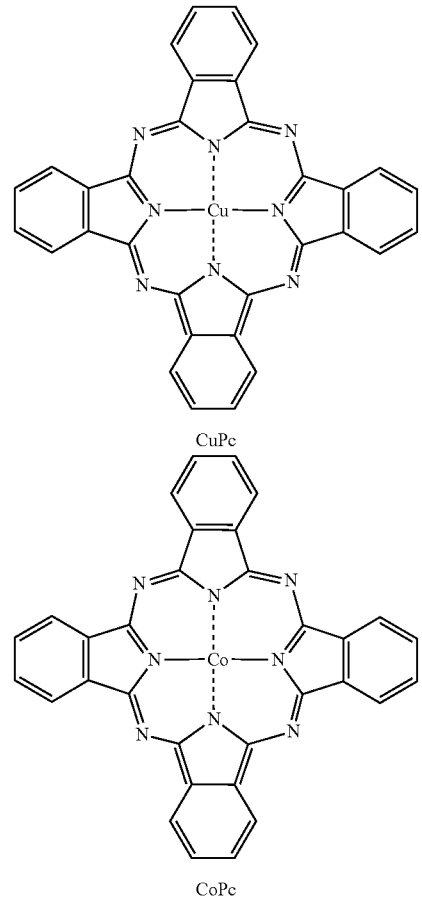

CuPc

CoPc

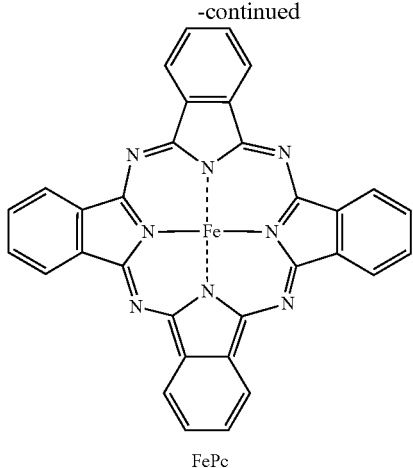

FePc

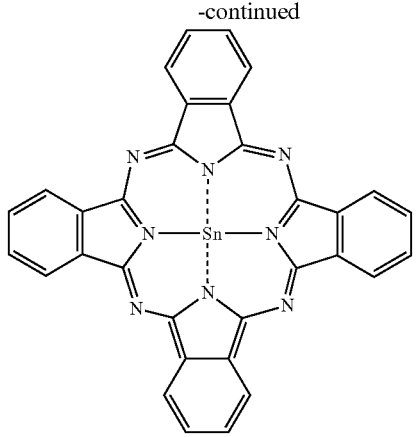

SnPc

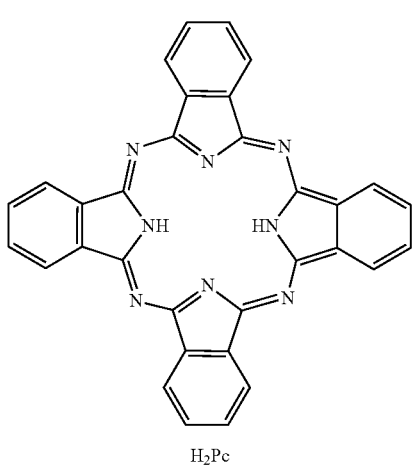

H₂Pc

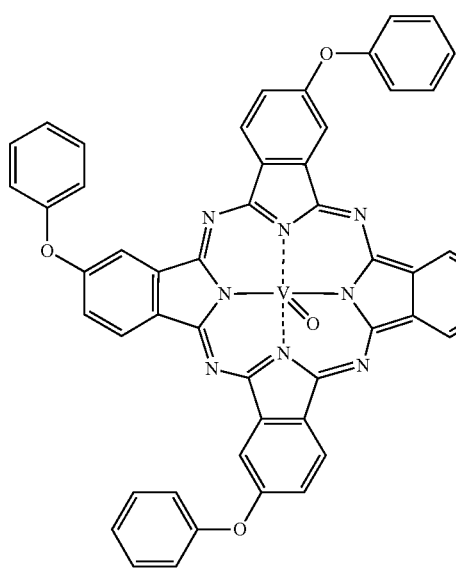

PhO—VOPc

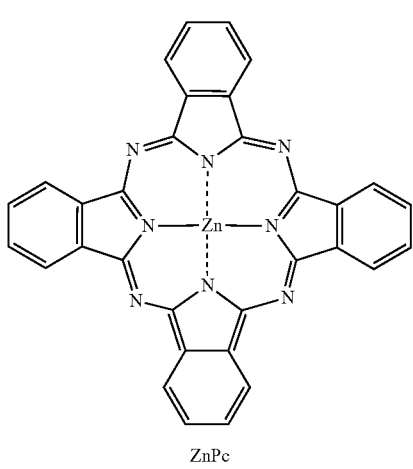

ZnPc

Another embodiment of the present invention is a light-emitting element having the above structure, in which the second substance is a metal complex having a metal-oxygen bond and an aromatic ligand.

Another embodiment of the present invention is a light-emitting element having the above structure, in which the second substance is a metal complex having a metal-oxygen double bond.

Another embodiment of the present invention is a light-emitting element having the above structure, in which the metal complex is a phthalocyanine-based material.

Another embodiment of the present invention is a light-emitting element having the above structure, in which the phthalocyanine-based material is any of substances represented by the following structural formulae.

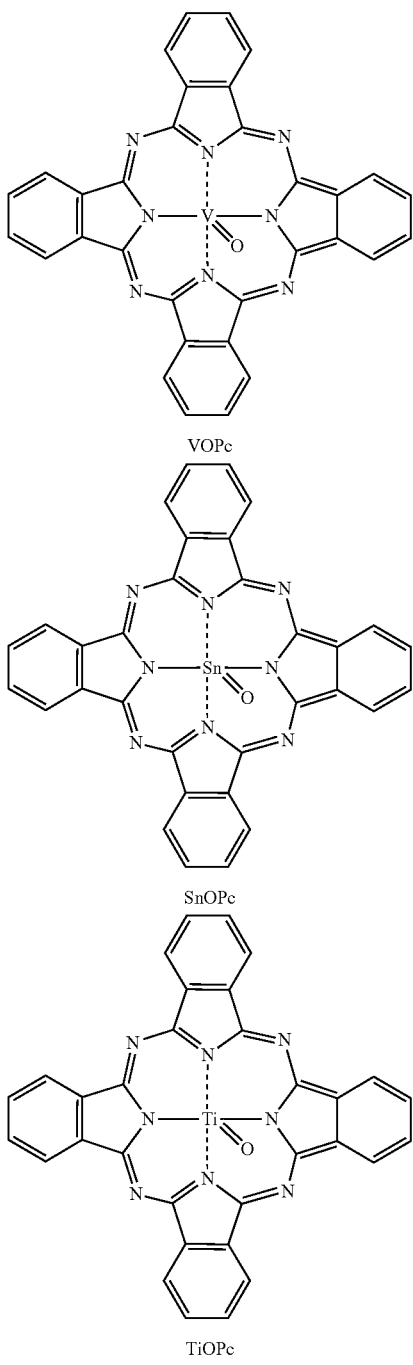

VOPc

SnOPc

TiOPc

Another embodiment of the present invention is a light-emitting element having the above structure, in which the alkaline earth metal contained in the electron transport layer is calcium, strontium, or barium.

Another embodiment of the present invention is a light-emitting element having the above structure, in which the alkaline earth metal contained in the electron transport layer is calcium.

Another embodiment of the present invention is a light-emitting element having the above structure, in which the acceptor substance is an oxide of a transition metal.

Another embodiment of the present invention is a light-emitting element having the above structure, in which the acceptor substance is an oxide of a metal belonging to any of Groups 4 to 8 in the periodic table.

Another embodiment of the present invention is a light-emitting element having the above structure, in which the acceptor substance is molybdenum oxide.

Another embodiment of the present invention is a light-emitting element having the above structure, in which the first layer has a structure in which a layer containing the first substance and a layer containing the acceptor substance are stacked.

Another embodiment of the present invention is a light-emitting device manufactured using a plurality of the light-emitting elements each having the above structure.

Another embodiment of the present invention is a light-emitting device having the above structure, in which the light-emitting elements are arranged in matrix and a distance between light-emitting regions in adjacent light-emitting elements is longer than or equal to 3 μm and shorter than or equal to 40 μm.

Another embodiment of the present invention is a light-emitting device having the above structure, in which the light-emitting elements are arranged in matrix and a distance between light-emitting regions in adjacent light-emitting elements is longer than or equal to 5 μm and shorter than or equal to 30 μm.

Another embodiment of the present invention is a display including the light-emitting device having the above structure.

Another embodiment of the present invention is an electronic device including the light-emitting device having the above structure.

According to one embodiment of the present invention, a light-emitting element capable of emitting light with high luminance can be provided, in which crosstalk between adjacent pixels can be suppressed without great increase in driving voltage even in the case where the light-emitting element is used in a high-definition display.

Further, according to one embodiment of the present invention, a high-definition light-emitting device can be provided, in which crosstalk between adjacent pixels is suppressed without great increase in driving voltage.

Furthermore, according to one embodiment of the present invention, a light-emitting device with high display quality can be provided. A display with high display quality can be provided. An electronic device including a display portion with high display quality can be provided.

BRIEF DESCRIPTION OF DRAWINGS

In the accompanying drawings:

FIGS. 3A and 3B illustrate a light-emitting device according to one embodiment of the present invention;

FIGS. 5A and 5B each illustrate a light-emitting device according to one embodiment of the present invention;

BEST MODE FOR CARRYING OUT THE INVENTION

Hereinafter, embodiments and examples of the present invention will be described with reference to the accompanying drawings. Note that the present invention can be carried out in many different modes, and it is easily understood by those skilled in the art that modes and details of the present invention can be modified in various ways without departing from the spirit and the scope of the present invention. Therefore, the present invention should not be construed as being limited to the description of the embodiments and examples.

Embodiment 1

Figure 1A:
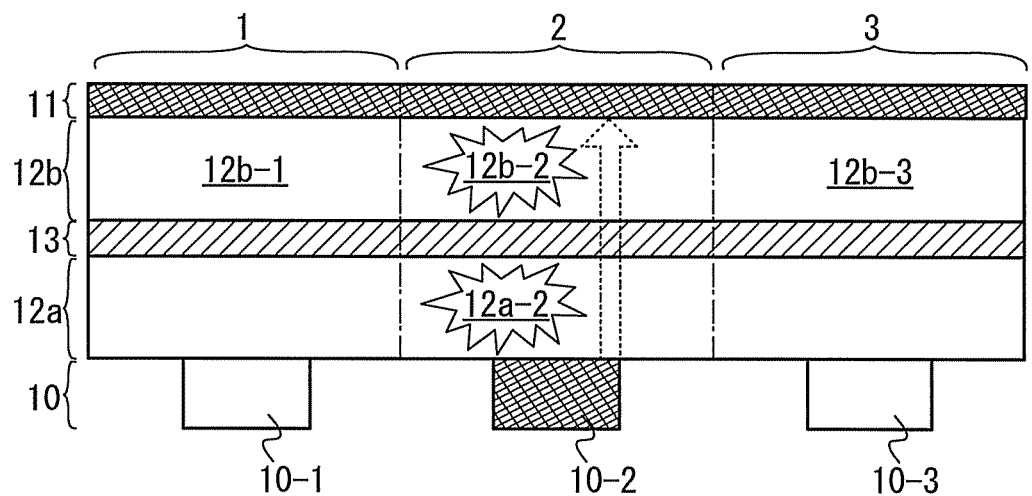
FIGS. 1A and 1B are conceptual diagrams of generation of crosstalk.
Figure 1B:
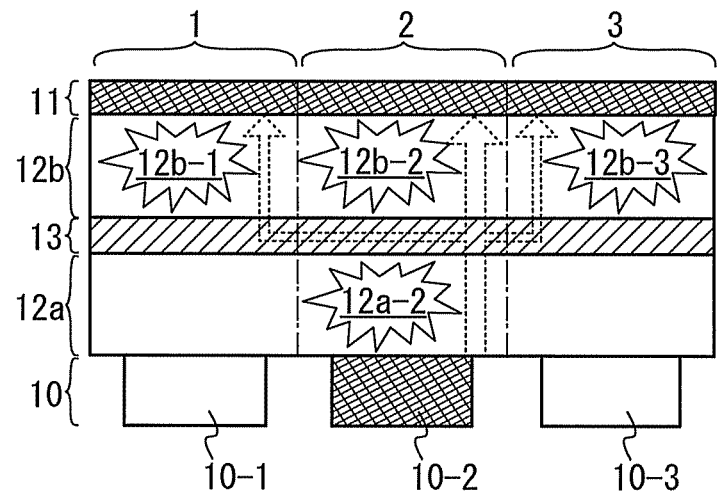
Figure 2:
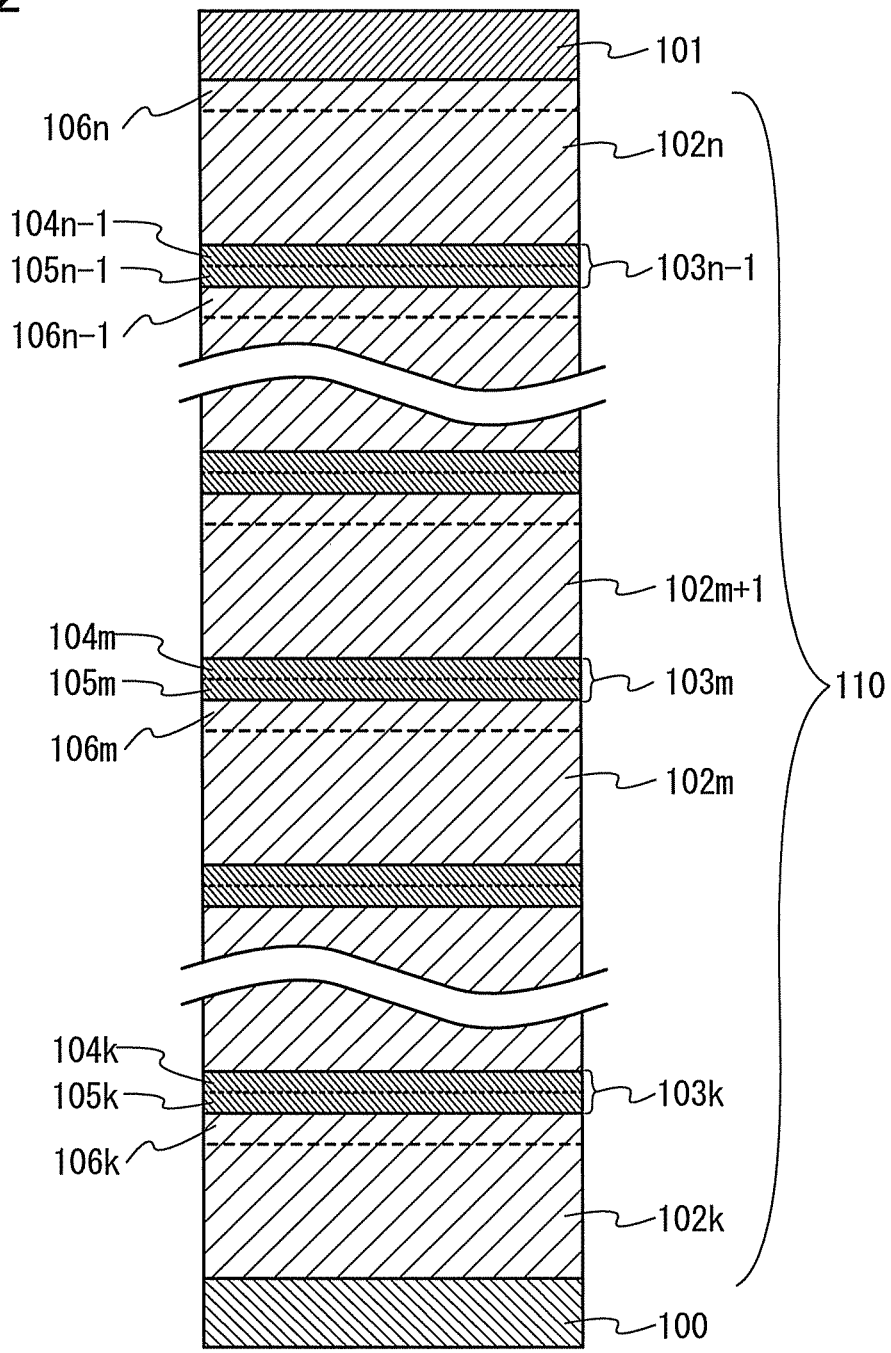
FIG. 2 illustrates a structure of a light-emitting element according to one embodiment of the present invention.

A conceptual diagram of a light-emitting element according to one embodiment of the present invention is illustrated in FIG. 2. The light-emitting element illustrated in FIG. 2 includes n EL layers between a pair of electrodes (an anode 100 and a cathode 101). The EL layer which is the closest to the anode 100 is referred to as a first EL layer 102$k$, and the EL layer which is the closest to the cathode 101 is referred to as an n-th EL layer 102$n$. The light-emitting element illustrated in FIG. 2 includes the EL layers (i.e., the first EL layer 102$k$ . . . an nigh EL layer 102$m$ . . . the n-th EL layer 102$n$); intermediate layers (i.e., a first intermediate layer 103$k$ . . . an m-th intermediate layer 103$m$ . . . a (n−1)-th intermediate layer 103$n$−1); first layers (i.e., a first first layer 104$k$ . . . an m-th first layer 104$m$ . . . a (n−1)-th first layer 104$n$−1); second layers (i.e., a first second layer 105$k$ . . . an m-th second layer 105$m$ . . . a (n−1)-th second layer 105$n$−1); electron transport layers (i.e., a first electron transport layer 106$k$ . . . an m-th electron transport layer 106$m$ . . . a (n−1)-th electron transport layer 106$n$−1 . . . an n-th electron transport layer 106$n$); and the like. Note that a plurality of the EL layers, a plurality of the intermediate layers, a plurality of the first layers, a plurality of the second layers, and a plurality of the electron transport layers are collectively referred to as an EL layer 102, an intermediate layer 103, a first layer 104, a second layer 105, and an electron transport layer 106, respectively, in some cases. Further, the EL layer 102 sandwiched between the anode 100 and the cathode 101 and the intermediate layers each existing between the EL layers are collectively referred to as a layer 110 containing an organic compound.

The m-th intermediate layer 103$m$ (in is a natural number, 1≤m≤n−1) is provided between and in contact with the m-th EL layer 102$m$ and the (m+1)-th EL layer 102$m$+1. The m-th intermediate layer 103$m$ includes the m-th first layer 104$m$ which is in contact with the (m+1)-th EL layer 102$m$+1 and the m-th second layer 105$m$ which is in contact with both the m-th first layer 104$m$ and the m-th EL layer 102$m$. Here, the intermediate layer 103 is in a floating state in which a power source or the like is not connected to the intermediate layer 103. Further, the first layer 104 serves as a charge generation layer and contains a first substance having a hole transport property and an acceptor substance with respect to the first substance having a hole transport property. The second layer 105 is an electron relay layer which has functions of accepting electrons generated in the first layer 104 and donating the electrons to the electron transport layer 106 of the EL layer 102, and contains at least a second substance having an electron transport property.

Further, the EL layer 102 includes a plurality of layers each containing an organic compound and having a specific function. As the plurality of layers, the EL layer 102 includes at least a light-emitting layer containing a light-emitting substance and the electron transport layer containing a third substance having an electron transport property. The m-th EL layer 102$m$ includes the m-th electron transport layer 106$m$. Note that in this embodiment, the electron transport layer is provided to be the closest to the cathode 101 in each of the EL layers. The m-th electron transport layer 106$m$ included in the m-th EL layer 102$m$ is formed so as to be in contact with the m-th second layer 105$m$ included in the m-th intermediate layer 103$m$. The electron transport layer 106 contains the third substance having an electron transport property and an alkaline earth metal (any of magnesium, calcium, strontium, and barium). In the electron transport layer 106, a concentration gradient of the alkaline earth metal is such that the concentration of the alkaline earth metal becomes lower from an interface with the second layer 105 to the anode 100.

Note that although an example in which a large number of the EL layers are provided is illustrated in FIG. 2, a light-emitting element which includes a smaller number of EL layers than the illustrated example, such as the case where n=2 or 3, is also of course one embodiment of the present invention. For example, in the case where the EL layer 102 includes two EL layers, n=2, the m-th EL layer 102$m$ corresponds to the first EL layer 102$k$, and the (m+1)-th EL layer 102$m$+1 corresponds to the n-th EL layer 102$n$.

As described above, the first layer 104 is a layer serving as a charge generation layer, and contains the first substance having a hole transport property and an acceptor substance. When voltage is applied between the electrodes (the anode 100 and the cathode 101), the acceptor substance in the first layer 104 extracts electrons from the first substance having a hole transport property to generate electrons and holes, and thus the first layer 104 serves as a charge generation layer. The holes generated in the m-th first layer 104m are injected to the (m+1)-th EL layer 102m+1 to be used for light emission of the (m+1)-th EL layer 102m+1. The electrons generated together with the holes in the m-th first layer 104m are injected to the electron transport layer of the m-th EL layer 102m (the m-th electron transport layer 106m) through the m-th second layer 105m to be used for light emission of the m-th EL layer 102m. The first layer 104 is preferably formed to a thickness of greater than or equal to 10 nm and less than or equal to 200 nm.

As the acceptor substance contained in the first layer 104, an oxide of a transition metal and an oxide of a metal belonging to any of Groups 4 to 8 in the periodic table can be used. Vanadium oxide, niobium oxide, tantalum oxide, chromium oxide, molybdenum oxide, tungsten oxide, manganese oxide, and rhenium oxide are preferable because of their high electron-accepting property. Molybdenum oxide, which has low hygroscopicity, is particularly preferable for an EL element which might be adversely affected by moisture.

As the first substance having a hole transport property, a variety of organic compounds such as an aromatic amine compound, a carbazole derivative, an aromatic hydrocarbon, and a high molecular compound (e.g., an oligomer, a dendrimer, or a polymer) can be used. A substance having a hole mobility of greater than or equal to $10^{-6}$ cm$^2$/Vs is preferably used. Note that other substances can also be used as long as the substances have higher hole transport property than an electron transport property.

Specific examples of the aromatic amine compound include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), N,N'-bis(4-methylphenyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 1,3,5-tris[N-(4-diphenylaminophenyl)-N-phenylamino]benzene (abbreviation: DPA3B), 4-phenyl-4'-(9-phenylfluoren-9-yl)triphenylamine (abbreviation: BPAFLP), and the like.

Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Besides, the following can be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), 1,4-bis[4-(N-carbazolyl)phenyl]-2,3,5,6-tetraphenylbenzene, and the like.

Specific examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Further, the aromatic hydrocarbon may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Specific examples of the high molecular compound include poly(N-vinylcarbazole) (abbreviation: PVK), poly(4-vinyltriphenylamine) (abbreviation: PVTPA), and the like.

Here, as the first substance having a hole transport property, which is used for the first layer 104, a substance which does not have an amine skeleton is preferably used. In the case where the first layer 104 is formed using the acceptor substance and the first substance having a hole transport property which does not have an amine skeleton, absorption based on charge transfer interaction is hard to occur as compared to the case where a substance having a hole transport property has an amine skeleton. Although absorption based on charge transfer interaction does not occur, the first layer 104 can sufficiently function as a charge generation layer. Hence, a layer which does not have an absorption peak in the visible light region and functions as a charge generation layer can be formed, whereby decrease in emission efficiency due to absorption of light can be prevented.

It has been conventionally considered important that a charge transfer complex be formed by oxidation-reduction reaction in a layer which functions as a charge generation layer. According to Patent Document 1, when the ionization potential of an organic compound which is used as a hole transport substance is 5.7 eV or higher, the oxidation-reduction reaction with the acceptor substance is less likely to occur. Thus, in order to promote the occurrence of oxidation-reduction reaction, a substance whose ionization potential is 5.7 eV or lower, specifically, a substance having an amine skeleton and a high electron-donating property, such as arylamine, has been conventionally considered to be necessary as an organic compound which is used as a hole transport substance in a charge generation layer. However, when oxidation-reduction reaction occurs between such a compound having an amine skeleton and the acceptor substance and a charge transfer complex is formed, absorption based on charge transfer interaction occurs in the visible light region and the infrared region. Such absorption, particularly absorption in the visible light region triggers reduction in emission efficiency. However, formation of a charge transfer complex has been conventionally considered to be indispensable for a charge generation layer and absorption to be inevitable.

However, when the first layer 104 is formed using a hole transport substance which does not have an amine skeleton and has a high ionization potential as the first substance together with the acceptor substance, a layer which does not show absorption based on charge transfer interaction but functions as a charge generation layer can be obtained. In this case, charge is considered to be generated by application of an electric field, which is different from a concept of a conventional charge generation layer. In fact, 9-[4-(10-phenyl-9-anthryl)phenyl]-9H-carbazole (abbreviation: CzPA) that is a carbazole derivative which is a hole transport substance which do not have an amine skeleton has an ionization potential of 5.7 eV (measured with AC-2, product of Riken Keiki Co., Ltd.), which is considerably high for a value of an ionization potential. Probably because of the above, absorption based on charge transfer interaction does not occur even if CzPA is mixed with molybdenum oxide that is an acceptor substance. However, when the first layer 104 is formed using a material in which CzPA and molybdenum oxide are mixed and a light-emitting element is manufactured using the first layer 104, the first layer 104 functions as a charge generation layer. Thus, although a light-emitting element of this embodiment includes a charge generation layer, decrease in emission efficiency due to absorption of visible light based on charge transfer interaction can be prevented because a hole transport substance which does not have an amine skeleton is used as the first substance having a hole transport property in the charge generation layer. Accordingly, the ionization potential of the hole transport substance which does not have an amine skeleton is preferably 5.7 eV or higher.

Note that examples of the hole-transport substance which does not have an amine skeleton include the above-described carbazole derivatives such as CBP, TCPB, CzPA, PCzPA, and 1,4-bis[4-(N-carbazolyl)phenyl]-2,3,5,6-tetraphenylbenzene; and aromatic hydrocarbon such as t-BuDNA, DPPA, t-BuDBA, DNA, DPAnth, t-BuAnth, DMNA, 2-tert-butyl-9,10-di(1-naphthyl)anthracene, 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, DPVBi, and DPVPA. Further, a polymer of a carbazole derivative, such as PVK, may be used.

For the first layer 104, a composite material in which an acceptor substance and the first substance having a hole transport property are contained so that the mass ratio of the acceptor substance to the hole-transport substance is grater than or equal to 0.1:1 and less than or equal to 4.0:1 is preferably used.

The first layer 104 can be formed to a thickness of greater than or equal to 10 nm and less than or equal to 200 nm. When the first layer 104 is formed using a composite material of the first substance having a hole transport property and the acceptor substance, a change in conductivity is small even when the thickness of the first layer 104 is increased; thus, increase in driving voltage of the light-emitting element due to increase in the thickness of the first layer 104 can be suppressed. When the first layer 104 is formed using such a material, adjustment of the thickness of the first layer 104 enables optical adjustment of the light-emitting element without increase in driving voltage.

The first layer 104 is not limited to a single layer in which both the first substance having a hole transport property and the acceptor substance are contained in the same film. The first layer 104 can have a stacked structure of a layer containing the first substance having a hole transport property and a layer containing the acceptor substance. Note that in the case of a stacked structure, in the m-th first layer 104m, a layer containing the first substance having a hole transport property is formed in contact with the (m+1)-th EL layer 102m+1, and a layer containing the acceptor substance is formed in contact with the m-th second layer 105m.

The second layer 105 is an electron relay layer which has functions of accepting electrons generated in the first layer 104 and donating the electrons to the electron transport layer 106 of the EL layer 102, and includes at least the second substance having an electron transport property. The second layer of the m-th intermediate layer 103m (the m-th second layer 105m) accepts electrons generated in the m-th first layer 104m and donates the electrons to the electron transport layer of the m-th EL layer 102m (the m-th electron transport layer 106m).

Here, the second layer 105 is formed so that the LUMO level of the second substance having an electron transport property in the second layer 105 is located between the LUMO level of the acceptor substance in the first layer 104 and the LUMO level of the third substance having an electron transport property in the electron transport layer 106. Further, in the case where a donor substance with respect to the second substance having an electron transport property is contained in the second layer 105, the donor level of the donor substance is also located between the LUMO level of the acceptor substance in the first layer 104 and the LUMO level of the third substance having an electron transport property in the electron transport layer 106. As a specific value of the energy level, the LUMO level of the second substance having an electron transport property in the second layer 105 is preferably greater than or equal to −5.0 eV, more preferably greater than or equal to −5.0 eV and less than or equal to −3.0 eV.

The light-emitting element of this embodiment, in which the first layer 104, the second layer 105, and the electron transport layer 106 have such energy relations, has a function of lowering an electron injection barrier when the second layer 105 injects the electrons generated in the first layer 104 to the EL layer 102, so that increase in driving voltage can be suppressed.

Note that as the second substance having an electron transport property in the second layer 105, a phthalocyanine-based material or a metal complex having a metal-oxygen bond and an aromatic ligand is preferably used.

In the case where a phthalocyanine-based material is used as the second material, specifically, any of copper(II) phthalocyanine (CuPc), phthalocyanine ($H_2Pc$), phthalocyanine tin (II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc) which are represented by the following structural formulae, is preferably used. Each of the phthalocyanine-based materials shown below is phthalocyanine which has Cu, Co, Fe, Zn, Sn, or V as a central metal or phthalocyanine which does not have a central metal.

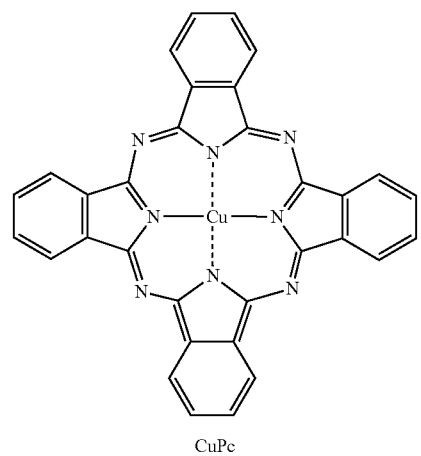

CuPc

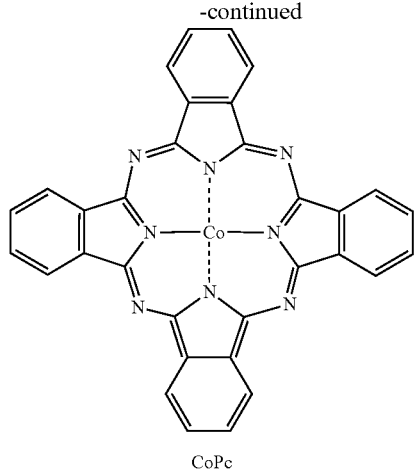

CoPc

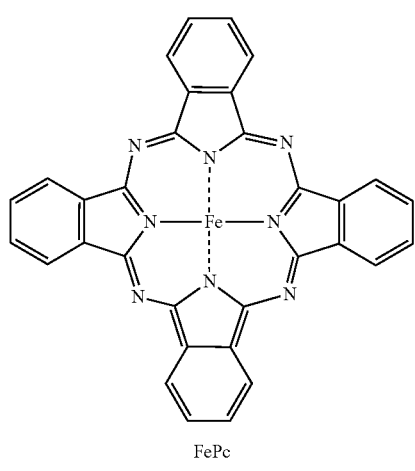

FePc

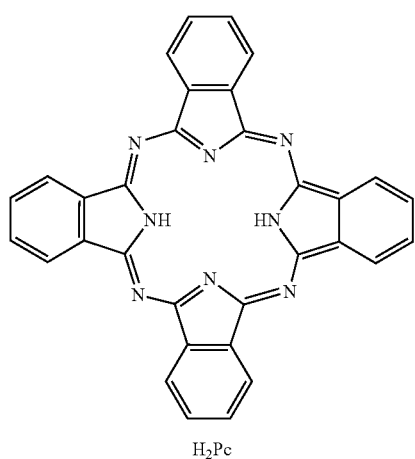

H₂Pc

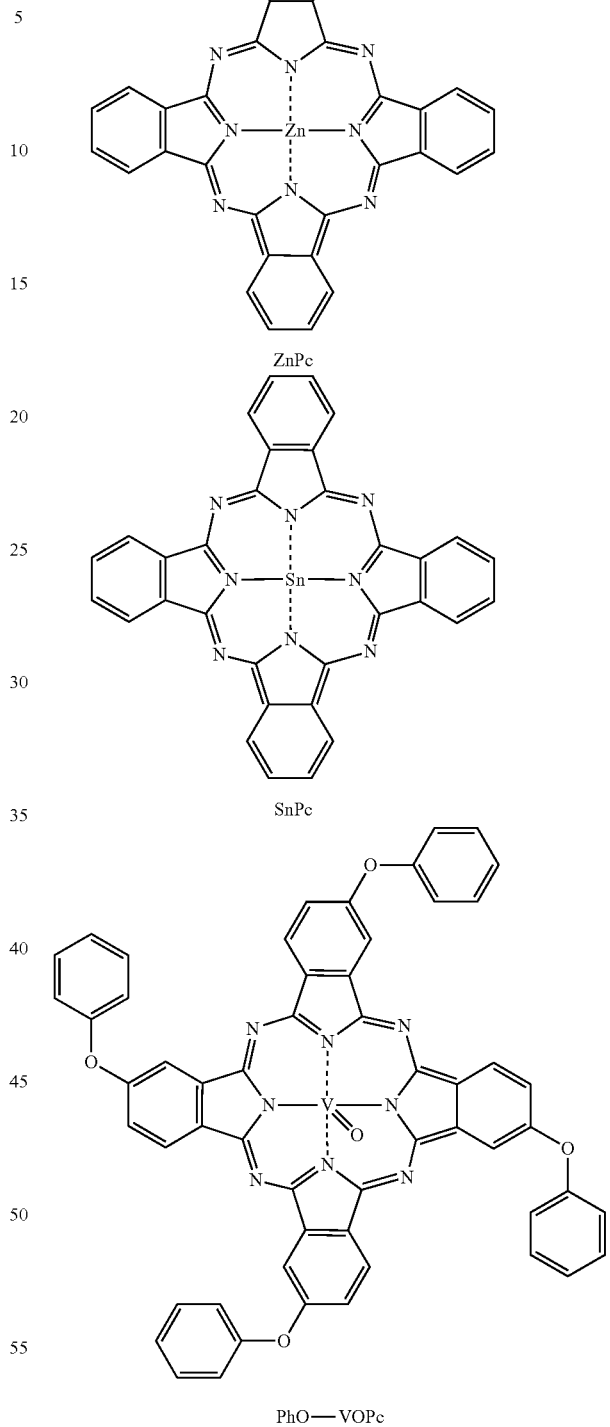

ZnPc

SnPc

PhO—VOPc

In the case where a metal complex having a metal-oxygen bond and an aromatic ligand is used as the second substance, a metal complex having a metal-oxygen double bond is preferably used. A metal-oxygen double bond has an acceptor property (a property of easily accepting electrons); thus, electrons can be transferred (donated and accepted) more easily. Further, a metal complex having a metal-oxygen double bond is considered stable. Thus, the use of a metal complex having a metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) which are represented by the following structural formulae is preferable because a metal-oxygen double bond is more likely to act on another molecular in terms of a molecular structure and an acceptor property is high. In other words, in the phthalocyanine-based materials shown below, a central metal (V, Sn, or Ti) is bonded to an oxygen atom and forms a metal-oxygen double bond; thus, electrons can be transferred (donated and accepted) more easily and a light-emitting element can be driven at low voltage.

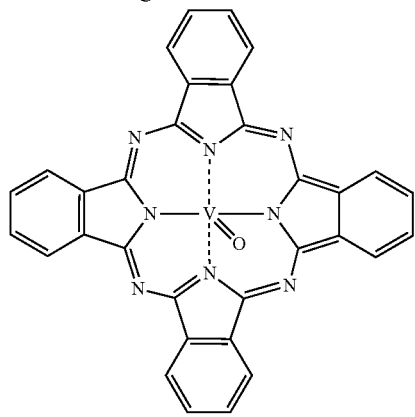

VOPc

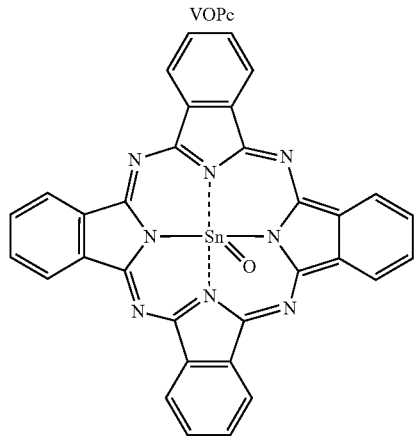

SnOPc

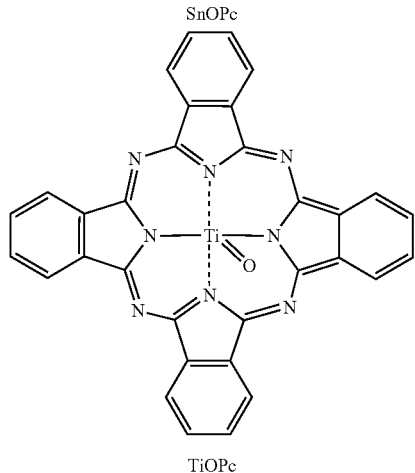

TiOPc

Note that as the phthalocyanine-based materials described above, a phthalocyanine-based material having a phenoxy group is preferable. Specifically, a phthalocyanine derivative having a phenoxy group, such as vanadyl 2,9,16,23-tetraphenoxy-29H,31H-phthalocyanine (PhO-VOPc; produced by Synthon BV) which is represented by the following structural formula is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

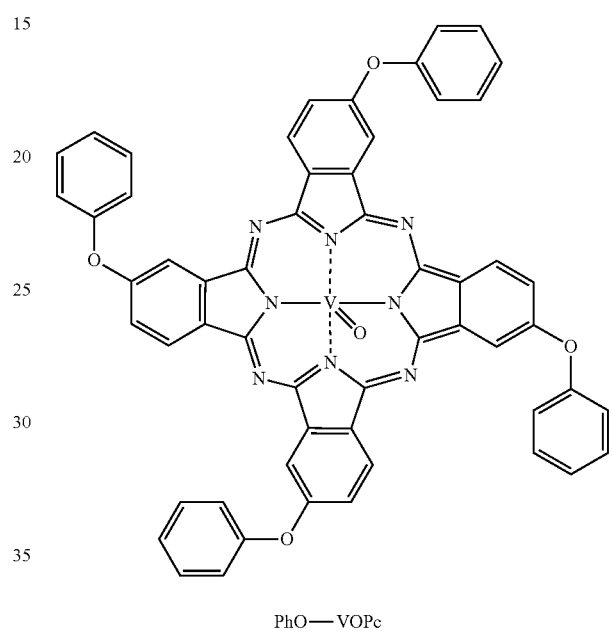

PhO—VOPc

The second layer 105 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the second layer 105, electrons can be transferred easily and the light-emitting element can be driven at lower voltage.

In the case where a donor substance is contained in the second layer 105, in addition to the materials described above as the second substance having an electron transport property, a substance having a LUMO level greater than the acceptor level of the acceptor substance contained in the first layer which is a charge generation layer can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the second layer 105 because of its stability. Furthermore, among the nitrogen-containing condensed aromatic compounds, a structure in which a compound having an electron-withdrawing group such as a cyano group or a fluoro group is used is a preferable structure because electrons are easily accepted in the second layer 105.

As specific examples of the perylene derivative, the following can be given: 3,4,9,10-perylenetetracarboxylic dianhydride (abbreviation: PTCDA), 3,4,9,10-perylenetetracarboxylic bisbenzimidazole (abbreviation: PTCBI), N,N'-dioctyl-3,4,9,10-perylenetetracarboxylic diimide (abbreviation: PTCDI-C8H), N,N-dihexyl-3,4,9,10-perylenetetracarboxylic diimide (abbreviation: Hex PTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: $HAT(CN)_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: $F_{16}CuPc$), N,N'-bis(2,2,3,3,4,4,5,5,6,6,7,7,8,8-pentadecafluorooctyl-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophen) (abbreviation: DCMT), methanofullerene (e.g., [6,6]-phenyl $C_{61}$ butyric acid methyl ester), or the like can be used.

Note that in the case where a donor substance is contained in the second layer 105, the second layer may be formed by a method such as co-deposition of the second substance having an electron transport property and the donor substance. In the case where the donor substance is contained, the second layer 105 is preferably formed to a thickness of 1 nm to 10 nm, in which case generation of crosstalk due to the second layer 105 can be suppressed. Note that for the same reason, the second layer 105 preferably contains the donor substance so that the mass ratio of the donor substance to the second substance is grater than or equal to 0.001:1 and less than or equal to 0.1:1.

Each of the EL layers is formed by stacking a plurality of layers each having a different function, and includes at least a light-emitting layer (not illustrated) containing a light-emitting substance and the electron transport layer containing the third substance having an electron transport property.

The electron transport layer 106 is provided in contact with the second layer 105, and contains the third substance having an electron transport property and an alkaline earth metal (any of magnesium, calcium, strontium, and barium). In the electron transport layer 106, a concentration gradient of the alkaline earth metal is such that the concentration of the alkaline earth metal becomes lower from an interface with the second layer 105 to the anode 100. Note that this concentration gradient can be generated in such a manner that diffusion occurs by formation of a very thin film of the alkaline earth metal between the electron transport layer 106 and the second layer 105.

Further, a very thin layer of the alkaline earth metal having a thickness of less than or equal to 5 nm may remain between the second layer 105 and the electron transport layer 106. Note that as the very thin layer of the alkaline earth metal, a state where the alkaline earth metal exists in an island shape is included. In this case, a concentration gradient of the alkaline earth metal in the electron transport layer 106 is such that the concentration of the alkaline earth metal becomes lower from an interface between the very thin layer of the alkaline earth metal and the electron transport layer 106 to the anode 100.

Note that in the case where a donor substance is contained in the second layer 105, the alkaline earth metal diffuses also into the second layer 105; therefore, the diffused alkaline earth metal into the second layer 105 may be used as a donor substance.

Meanwhile, if the second layer 105 were not provided and such an electron transport layer 106 (or a very thin layer of an alkaline earth metal) were formed in contact with the first layer 104 containing an acceptor substance, driving voltage of a light-emitting element would be greatly increased due to interaction between the acceptor substance contained in the first layer 104 and the alkaline earth metal. Therefore, the second layer 105 is formed between the first layer 104 and the electron transport layer 106 (or the very thin layer of the alkaline earth metal), so that an injection barrier when the electrons generated in the first layer 104 are injected to the electron transport layer 106 can be reduced and interaction between the acceptor substance and the alkaline earth metal can be prevented; thus, great increase in driving voltage can be avoided. In other words, although simply stacking the electron transport layer 106 containing an alkaline earth metal (or the very thin layer of an alkaline earth metal) and the first layer containing an acceptor substance can suppress crosstalk, it also increases driving voltage. The second layer 105 is formed to overcome the trade-off.

Further, when a substance contained in the electron transport layer 106 or a substance forming the very thin layer is an alkaline earth metal, interference between adjacent pixels can be effectively reduced even in a high-definition display. Note that a structure in which an alkaline earth metal contained in the electron transport layer 106 and an alkaline earth metal forming the very thin layer are any of calcium, strontium, and barium is a preferable structure because an electron injection property of the metal is high.

As the third substance having an electron transport property, a metal complex having a quinoline skeleton or a benzoquinoline skeleton, such as tris(8-quinolinolato)aluminum (abbreviation: Alq), tris(4-methyl-8-quinolinolato)aluminum (abbreviation: $Almq_3$), bis(10-hydroxybenzo[h]quinolinato)beryllium (abbreviation: $BeBq_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$), or the like can be used. Further alternatively, besides the metal complexes, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP) can be used. The substances mentioned here are mainly ones that have an electron mobility of $10^{-6}$ $cm^2/V \cdot s$ or higher. Note that substances other than those may be used as long as they have an electron transport property higher than a hole transport property. Furthermore, the electron transport layer 106 is not limited to a single layer, and two or more layers formed of the aforementioned substances may be stacked. A high molecular compound such as poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can also be used.

Note that an electron transport layer is not necessarily formed in the EL layer which is in contact with the cathode. In the case where an electron transport layer is formed in the EL layer which is in contact with the cathode, an alkaline earth metal is not necessarily contained (in the electron transport layer). Further, a second layer is not necessarily formed between the cathode and the EL layer. Therefore, even in the case where an electron transport layer is formed in the EL layer, the electron transport layer is not necessarily in contact with the second layer.

The light-emitting layer contains a light-emitting substance. The light-emitting substance can be a fluorescent compound or a phosphorescent compound which is described below.

Examples of the fluorescent compound include the following: N,N'-bis[4-(9H-carbazol-9-yl)phenyl]-N,N-diphenylstilbene-4,4'-diamine (abbreviation: YGA2S); 4-(9H-carbazol-9-yl)-4'-(10-phenyl-9-anthryl)triphenylamine (abbreviation: YGAPA); 4-(9H-carbazol-9-yl)-4'-(9,10-diphenyl-2-anthryl)triphenylamine (abbreviation: 2YGAPPA); N,9-diphenyl-N-[4-(10-phenyl-9-anthryl)phenyl]-9H-carbazol-3-amine (abbreviation: PCAPA); perylene; 2,5,8,11-tetra-tert-butylperylene (abbreviation: TBP); 4-(10-phenyl-9-anthryl)-4'-(9-phenyl-9H-carbazol-3-yl) triphenylamine (abbreviation: PCBAPA); N,N'''-(2-tert-butylanthracene-9,10-diyldi-4,1-phenylene)bis[N,N',N''-triphenyl-1,4-phenylenediamine] (abbreviation: DPABPA); N,9-diphenyl-N-[4-(9,10-diphenyl-2-anthryl)phenyl]-9H-carbazol-3-amine (abbreviation: 2PCAPPA); N-[4-(9,10-diphenyl-2-anthryl)phenyl]-N,N',N''-triphenyl-1,4-phenylenediamine (abbreviation: 2DPAPPA); N,N,N',N',N'',N'',N''',N'''-octaphenyldibenzo[g,p]chrysene-2,7,10,15-tetraamine (abbreviation: DBC1); coumarin 30; N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); 9,10-bis(1,1'-biphenyl-2-yl)-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); coumarin 545T; N,N'-diphenylquinacridone (abbreviation: DPQd); rubrene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); 2-{methyl-6-[2-(2,3,6,7-tetrahydro-1H,5H-benzo[ij]quinolizin-9-yl)ethenyl]-4H-pyran-4-ylidene}propanedinitrile (abbreviation: DCM2); N,N,N',N'-tetrakis(4-methylphenyl)tetracene-5,11-diamine (abbreviation: p-mPhTD); 7,14-diphenyl-N,N,N',N'-tetrakis(4-methylphenyl)acenaphtho[1,2-a]fluoranthene-3,10-diamine (abbreviation: p-mPhAFD); 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 2-(2,6-bis{2-[4-(dimethylamino)phenyl]ethenyl}-4H-pyran-4-ylidene)propanedinitrile (abbreviation: BisDCM); 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM); and the like.

Examples of the phosphorescent compound include the following: bis[2-(4',6'-difluorophenyl)pyridinato-N,$C^{2'}$]iridium(III)tetrakis(1-pyrazolyl)borate (abbreviation: FIr6); bis[2-(4',6'-difluorophenyl)pyridinato-N,$C^{2'}$]iridium(III)picolinate (abbreviation: FIrpic); bis[2-(3',5'-bistrifluoromethylphenyl)pyridinato-N,$C^{2'}$]iridium(III) picolinate (abbreviation: Ir(CF$_3$ppy)$_2$(pic)); bis[2-(4',6'-difluorophenyl)pyridinato-N,$C^{2'}$]iridium(III)acetylacetonate (abbreviation: FIr(acac)); tris(2-phenylpyridinato)iridium(III) (abbreviation: Ir(ppy)$_3$); bis(2-phenylpyridinato)iridium(III)acetylacetonate (abbreviation: Ir(ppy)$_2$(acac)); bis(benzo[h]quinolinato)iridium(III)acetylacetonate (abbreviation: Ir(bzq)$_2$(acac)); tris(benzo[h]quinolinato)iridium(III) (abbreviation: Ir(bzq)$_3$); bis(2,4-diphenyl-1,3-oxazolato-N,$C^{2'}$)iridium(III)acetylacetonate (abbreviation: Ir(dpo)$_2$(acac)); bis[2-(4'-perfluorophenylphenyl)pyridinato]iridium(III)acetylacetonate (abbreviation: Ir(p-PF-ph)$_2$(acac)); bis(2-phenylbenzothiazolato-N,$C^{2'}$)iridium(III)acetylacetonate (abbreviation: Ir(bt)$_2$(acac)); (acetylacetonato)bis[2,3-bis(4-fluorophenyl)-5-methylpyrazinato]iridium(III) (abbreviation: Ir(Fdppr-Me)$_2$(acac)); (acetylacetonato)bis{2-(4-methoxyphenyl)-3,5-dimethylpyrazinato}iridium(III) (abbreviation: Ir(dmmoppr)$_2$(acac)); bis[2-(2'-benzo[4,5-a]thienyl)pyridinato-N,$C^{3'}$]iridium(III)acetylacetonate (abbreviation: Ir(btp)$_2$(acac)); bis(1-phenylisoquinolinato-N,$C^{2'}$)iridium(III)acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); (dipivaloylmethanato)bis(2,3,5-triphenylpyrazinato)iridium(III) (abbreviation: Ir(tppr)$_2$(dpm)); (acetylacetonato)bis(2,3,5-triphenylpyrazinato)iridium(III) (abbreviation: Ir(tppr)$_2$(acac)); 2,3,7,8,12,13,17,18-octaethyl-21H,23H-porphyrin platinum(II) (abbreviation: PtOEP); tris(acetylacetonato)(monophenanthroline)terbium(III) (abbreviation: Tb(acac)$_3$(Phen)); tris(1,3-diphenyl-1,3-propanedionato)(monophenanthroline)europium(III) (abbreviation: Eu(DBM)$_3$(Phen)); tris[1-(2-thenoyl)-3,3,3-trifluoroacetonato](monophenanthroline)europium(III) (abbreviation: Eu(TTA)$_3$(Phen)); and the like.

Note that the light-emitting layer preferably has a structure in which these light-emitting substances are dispersed in a host material. As the host material, for example, a hole transport substance such as an aromatic amine compound such as NPB, TPD, TCTA, TDATA, MTDATA, or 4,4'-bis[N-(spiro-9,9'-bifluoren-2-yl)-N-phenylamino]biphenyl (abbreviation: BSPB) or a carbazole derivative such as PCzPCA1, PCzPCA2, PCzPCN1, CBP, TCPB, or CzPA can be used.

Alternatively, a hole transport substance which contains a high molecular compound, such as poly[N-(4-{N'-[4-(4-diphenylamino)phenyl]phenyl-N'-phenylamino}phenyl) methacrylamide] (abbreviation: PTPDMA) or poly[N,N'-bis (4-butylphenyl)-N,N'-bis(phenyl)benzidine] (abbreviation: Poly-TPD) can be used.

Alternatively, as the host material, for example, an electron transport substance such as a metal complex having a quinoline skeleton or a benzoquinoline skeleton, such as Alq, Almq$_3$, BeBq$_2$, or BAlq; a metal complex having an oxazole-based ligand or a thiazole-based ligand, such as Zn(BOX)$_2$ or Zn(BTZ)$_2$; PBD; OXD-7; CO11; TAZ; BPhen; or BCP can be used.

At least one light-emitting layer may be included in each of the EL layers. Alternatively, a plurality of light-emitting layers containing different light-emitting substances and/or host materials or a plurality of light-emitting layers containing the same light-emitting substance and the host material but in different concentrations may be included in each of the EL layers. Needless to say, structures of light-emitting layers in each of the EL layers may be the same or different from each other.

Other than the electron transport layer and the light-emitting layer forming each of the EL layers may include a layer containing a hole injection substance and having a hole injection property (a hole injection layer), a layer containing a hole transport substance and having a hole transport property (a hole transport layer), a layer containing a bipolar substance and having a bipolar property (having both an electron transport property and a hole transport property), and the like. Each of the EL layers can be formed in combination of the above layers and another known functional layer as appropriate. Note that in the n-th EL layer 102n which is in contact with the cathode 101, a layer containing an electron injection substance and having an electron injection property (an electron injection layer) may be further provided as a layer which is the closest to the cathode 101. Furthermore, a charge generation layer may be provided between the first EL layer 102k and the anode 100 and between the n-th EL layer 102n and the cathode 101.

The hole injection layer, the hole transport layer, and the electron injection layer will be described below.

The hole injection layer is a layer containing a hole injection substance. As the hole injection substance, for example, a metal oxide such as molybdenum oxide, vanadium oxide, ruthenium oxide, tungsten oxide, or manganese oxide can be used. A phthalocyanine-based compound such as phthalocyanine (abbreviation: $H_2Pc$), or copper(II) phthalocyanine (abbreviation: CuPc) can also be used. A polymer such as PEDOT/PSS (abbreviation) can be used.

The hole transport layer contains a hole transport substance. As the hole transport substance contained in the hole transport layer, a substance similar to any of the hole transport substances that can be contained in the above first layer 104 can be used. Therefore, the above description is referred to here. Note that the hole transport layer may have a stacked structure of two or more layers containing the above substances as well as a single-layer structure.

The electron injection layer which can be provided in the n-th EL layer 102n contains an electron injection substance. As the electron injection substance, the following can be given: an alkali metal, an alkaline earth metal, and a compound of these metals, such as lithium fluoride (LiF), cesium fluoride (CsF), and calcium fluoride ($CaF_2$). Alternatively, an electron transport substance containing an alkali metal, an alkaline earth metal, or a compound of these metals (e.g., Alq (abbreviation) containing magnesium (Mg)) can be used as the electron injection substance. Such a structure makes it possible to increase the efficiency of injection of electrons from the cathode 101.

A charge generation layer may be provided between the first EL layer 102k and the anode 100 or between the n-th EL layer 102n and the cathode 101. In the case where a charge generation layer is provided between the first EL layer 102k and the anode 100 or between the n-th EL layer 102n and the cathode 101, the charge generation layer is formed using a composite material containing a hole transport substance and an acceptor substance. Note that the charge generation layer is not limited to a layer containing a hole transport substance and an acceptor substance in the same film and may be a stack of a layer containing a hole transport substance and a layer containing an acceptor substance. However, in the case of the stacked-layer structure, the layer containing an acceptor substance is in contact with the anode 100 or the cathode 101.

When a charge generation layer is provided between the first EL layer 102k and the anode 100 or between the n-th EL layer 102n and the cathode 101, the anode 100 or the cathode 101 can be formed without consideration of a work function of a substance for forming the electrodes. Note that a structure and a material similar to those of the above first layer 104 can be used for the charge generation layer which is provided between the first EL layer 102k and the anode 100 or between the n-th EL layer 102n and the cathode 101. Therefore, the above description is referred to.

Note that each of EL layers can be formed by stacking the above layers in appropriate combination. As a formation method of the EL layers, a variety of methods (e.g., a dry process such as a vacuum deposition method, a wet process such as an ink-jet method or a spin coating method, or the like) can be used depending on a material to be used. Each layer may be formed by a different formation method.

The anode 100 is preferably formed using a metal, an alloy, a conductive compound, a mixture thereof, or the like that has a high work function (specifically, a work function of 4.0 eV or higher is preferably). Specific examples are as follows: indium tin oxide (ITO), indium tin oxide containing silicon or silicon oxide, indium zinc oxide (IZO), indium oxide containing tungsten oxide and zinc oxide, and the like. Alternatively, gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (e.g., titanium nitride), molybdenum oxide, vanadium oxide, ruthenium oxide, tungsten oxide, manganese oxide, titanium oxide, or the like may be used. Further alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used. Note that, as described above, in the case where a charge production region is provided in contact with the anode 100, a variety of conductive materials such as Al and Ag can be used for the anode 100 regardless of their work functions.

The anode 100 may be formed by a sputtering method in general. For example, a film of indium zinc oxide (IZO) can be formed by a sputtering method using a target in which zinc oxide is added to indium oxide at 1 to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively. Alternatively, the anode 100 can be formed by a sol-gel method or the like.

The cathode 101 can be formed using a metal, an alloy, a conductive compound, a mixture thereof, or the like that has a low work function (specifically, a work function of 3.8 eV or lower is preferable). For example, any of the following can be used: elements that belong to Group 1 or Group 2 in the periodic table, that is, alkali metals such as lithium (Li) and cesium (Cs) and alkaline earth metals such as magnesium (Mg), calcium (Ca), and strontium (Sr), and alloys thereof (e.g., MgAg and AlLi), rare earth metals such as europium (Eu) and ytterbium (Yb), alloys thereof, and the like. Note that a film of an alkali metal, an alkaline earth metal, or an alloy thereof can be formed by a vacuum deposition method. An alloy film of an alkali metal or an alkaline earth metal can also be formed by a sputtering method. Further, silver paste or the like can be deposited by an ink-jet method or the like.

Alternatively, the cathode 101 can be formed using a stack of a film of an alkali metal compound, an alkaline earth metal compound, or a rare earth metal compound (e.g., lithium fluoride (LiF), lithium oxide (LiOx), cesium fluoride (CsF), calcium fluoride (CaF$_2$), or erbium fluoride (ErF$_3$)) and a film of a metal such as aluminum. Note that, as described above, in the case where a charge generation layer is provided in contact with the cathode 101, a variety of conductive materials can be used for the cathode 101 regardless of their work functions.

Note that in the light-emitting element described in this embodiment, at least one of the anode 100 and the cathode 101 may have a property of transmitting visible light. The light-transmitting property can be ensured with the use of a transparent electrode such as an ITO electrode, or by reduction in the thickness of the electrode. Alternatively, a stacked structure of a thin material and a transparent electrode may be used.

Since the light-emitting element of this embodiment includes a plurality of the EL layers, light that is a combination of beams of light emitted from respective EL layers can be obtained. In other words, in the case where a plurality of the EL layers each including a light-emitting layer containing the same light-emitting substance is stacked, higher luminance can be obtained as compared to a light-emitting element formed using only one EL layer including the light-emitting layer containing the same light-emitting substance even with the same current density. Further, in the case where the light-emitting element of this embodiment is formed by stacking the EL layers containing different light-emitting substances exhibiting different emission colors, a light-emitting element having a broad spectrum or a light-emitting element exhibiting white light emission can be obtained. A display including a light-emitting element exhibiting white light emission and a color filter is advantageous in achieving higher definition.

In the light-emitting element of this embodiment, which has the above structure, the electron transport layer 106 and the second layer 105 are formed in contact with each other, the electron transport layer 106 contains an alkaline earth metal, and a concentration gradient of the alkaline earth metal is such that the concentration of the alkaline earth metal becomes lower from the interface between the electron transport layer 106 and the second layer 105 to the anode. Therefore, even when a light-emitting element in which a plurality of EL layers is separated from each other by a charge generation layer is used in a high-definition display (e.g., a distance between light-emitting regions of adjacent light-emitting elements is shorter than or equal to 40 μm), an interference phenomenon between the adjacent light-emitting elements can be effectively reducing without great increase in driving voltage and the display can provide a high-quality image. Note that the light-emitting element in which a plurality of EL layers is separated from each other by a charge generation layer is a light-emitting element which easily realizes a high current efficiency, a broad emission spectrum, or white light emission.

Embodiment 2

In this embodiment, an example of a light-emitting device which is manufactured using the light-emitting element described in Embodiment 1 will be described. Note that the light-emitting device in one embodiment of the present invention is not limited to a light-emitting device having a structure described below, and it includes, in its category, all modes in each of which a display portion (e.g., a pixel portion 602 in this embodiment) includes the light-emitting element described in Embodiment 1.

In this embodiment, an example of a light-emitting device manufactured using the light-emitting element described in Embodiment 1 will be described with reference to FIGS. 3A and 3B. Note that FIG. 3A is a top view illustrating the light-emitting device and FIG. 3B is a cross-sectional view taken along lines A-A' and B-B' in FIG. 3A. The light-emitting device includes a driver circuit portion (source line driver circuit) 601, a pixel portion 602, and a driver circuit portion (gate line driver circuit) 603 which are illustrated with dotted lines. These units control light emission of the light-emitting element. Further, reference numeral 604 denotes a sealing substrate and reference numeral 605 denotes a sealant. A portion surrounded by the sealant 605 is a space 607. The sealing substrate 604 may be provided with a desiccant 625.

Note that a lead wiring 608 is a wiring for transmitting signals to be input to the source line driver circuit 601 and the gate line driver circuit 603 and for receiving a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting device in this specification includes, in its category, not only the light-emitting device itself but also the light-emitting device provided with the FPC or the PWB.

Then, the cross-sectional structure will be described with reference to FIG. 3B. The driver circuit portion and the pixel portion are formed over an element substrate 610. Here, the source line driver circuit 601, which is the driver circuit portion, and one pixel of the pixel portion 602 are shown.

In the source line driver circuit 601, a CMOS circuit is formed in which an n-channel TFT 623 and a p-channel TFT 624 are combined. The driver circuit may be formed using various circuits such as a CMOS circuit, a PMOS circuit, or an NMOS circuit. Although a driver-integrated type where the driver circuit is formed over the substrate is described in this embodiment, a driver circuit is not necessarily formed over a substrate; a driver circuit may be formed outside the substrate.

The pixel portion 602 has a plurality of pixels, each of which includes a switching TFT 611, a current control TFT 612, a first electrode 613 which is electrically connected to a drain of the current control TFT 612, and a light-emitting element including the first electrode 613, a layer 616 containing an organic compound, and a second electrode 617.

Although the TFTs illustrated in FIGS. 3A and 3B are top gate transistors in which a gate electrode is provided on a side opposite to the substrate with a semiconductor layer interposed between the substrate and the gate electrode, structures of the TFTs are not particularly limited and bottom gate transistors may be used. In the case of a bottom gate transistor, the transistors may have a structure in which a protective film is formed over a semiconductor layer used to form a channel (a channel protective type) or a structure in which part of the semiconductor layer used to form a channel has a depression (a channel etch type).

The semiconductor layer for forming the TFTs may be formed using any material as long as the material exhibits semiconductor characteristics; for example, an element belonging to Group 14 in the periodic table such as silicon (Si) and germanium (Ge), a compound such as gallium arsenide and indium phosphide, an oxide such as zinc oxide and tin oxide, and the like can be given. Further, the semiconductor layer may have either a crystalline structure or an amorphous structure.

For the oxide exhibiting semiconductor characteristics (an oxide semiconductor), composite oxide of an element selected from indium, gallium, aluminum, zinc, and tin can be used. For example, zinc oxide (ZnO), indium oxide containing zinc oxide (IZO: indium zinc oxide), and oxide containing indium oxide, gallium oxide, and zinc oxide (IGZO: indium gallium zinc oxide) can be given. As specific examples of the crystalline semiconductor layer, a single crystal semiconductor, a polycrystalline semiconductor, and a microcrystalline semiconductor can be given. The above examples may be formed by laser crystallization or may be formed by crystallization through a solid-phase growth method using, for example, nickel.

Note that the microcrystalline semiconductor in this specification belongs to a metastable state which is intermediate between an amorphous state and a single crystal state when Gibbs free energy is considered. That is, the microcrystalline semiconductor is a semiconductor having a third state which is stable in terms of free energy and has a short range order and lattice distortion. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 at. % or more in order to terminate a dangling bond. Moreover, a rare gas element such as helium, argon, krypton, or neon may be included to further promote lattice distortion, so that stability is enhanced and a favorable microcrystalline semiconductor layer can be obtained.

When the semiconductor layer is formed using a substance having an amorphous structure, for example, amorphous silicon, it is preferable that a light-emitting device have only n-channel transistors in a circuit for driving the light-emitting element. This is because the manufacturing process of the light-emitting device is simplified. Zinc oxide (ZnO), indium oxide containing zinc oxide (IZO), oxide containing indium oxide, gallium oxide, and zinc oxide (IGZO), and the like are n-type semiconductors. Therefore, a transistor including any of these oxides in a semiconductor layer is an n-channel transistor. Note that the light-emitting device may have a circuit including either n-channel transistors or p-channel transistors, or may have a circuit including both n-channel transistors and p-channel transistors.

An end portion of the first electrode 613 is covered with an insulator 614. In order to obtain favorable coverage with the layer 616 containing an organic compound, which is formed to cover the first electrode 613 and the insulator 614, the insulator 614 is preferably formed to have a curved surface with curvature at its upper end portion or lower end portion. For example, positive type photosensitive acrylic is used as a material of the insulator 614, so that the insulator 614 can have a curved surface with a curvature radius (0.2 μm to 3 μm) only at the upper end portion. As a material of the insulator 614, either a negative type which becomes insoluble in etchant by irradiation with light or a positive type which becomes soluble in etchant by irradiation with light can be used.

The layer 616 containing an organic compound and the second electrode 617 are stacked over the first electrode 613, and thus the light-emitting element is formed. Here, the first electrode 613 serves as an anode and the second electrode 617 serves as a cathode. The layer 616 containing an organic compound has a structure similar to that of the layer 110 containing an organic compound described in Embodiment 1.

Although only one light-emitting element is illustrated in FIGS. 3A and 3B, the display includes a plurality of light-emitting elements which are formed in the same manner and arranged in matrix. The light-emitting device of this embodiment, which is one embodiment of the present invention, is a display having high display quality in which crosstalk to an adjacent pixel is effectively suppressed even in the case where it has extremely short distance between light-emitting regions of adjacent pixels and thus is a high-definition display. Note that this suppression of crosstalk is also characterized by not causing such increase in driving voltage as to hinder practical application.

The detailed structure and materials of the light-emitting element are described in Embodiment 1; therefore, the repeated description is omitted. The description in Embodiment 1 is to be referred to. Note that the first electrode 613, the layer 616 containing an organic compound, and the second electrode 617 in this embodiment correspond to the anode 100, the layer 110 containing an organic compound, and the cathode 101 in Embodiment 1, respectively.

The element substrate 610 in which TFTs for the driver circuit and the pixel portion as described above and the light-emitting element are formed is attached to the sealing substrate 604 with the sealant 605, so that a light-emitting device can be provided, in which the light-emitting element described in Embodiment 1 is provided in the space 607 surrounded by the element substrate 610, the sealing substrate 604, and the sealant 605. The space 607 is filled with filler, and may be filled with an inert gas (e.g., nitrogen or argon), the sealant 605, or the like.

An epoxy-based resin is preferably used for the sealant 605. It is preferable that the material allow as little oxygen and water as possible to penetrate therethrough. As a material for the sealing substrate 604, a plastic substrate formed using fiberglass-reinforced plastics (FRP), polyvinyl fluoride (PVF), polyester, acrylic, or the like can be used besides a glass substrate or a quartz substrate As described above, a light-emitting device of one embodiment of the present invention manufactured using the light-emitting element described in Embodiment 1 can be obtained.

The light-emitting device in this embodiment includes the light-emitting element described in Embodiment 1; thus, a high-definition light-emitting device having high display quality can be realized. Further, the light-emitting element described in Embodiment 1 has high current efficiency, can emit light with high luminance, and can realize suppression of crosstalk without great increase in driving voltage; therefore, the light-emitting device of this embodiment can be a light-emitting device having low driving voltage. Further, the light-emitting device of this embodiment can be a highly reliable light-emitting device having small degree of deterioration with driving time.

Figure 4A:
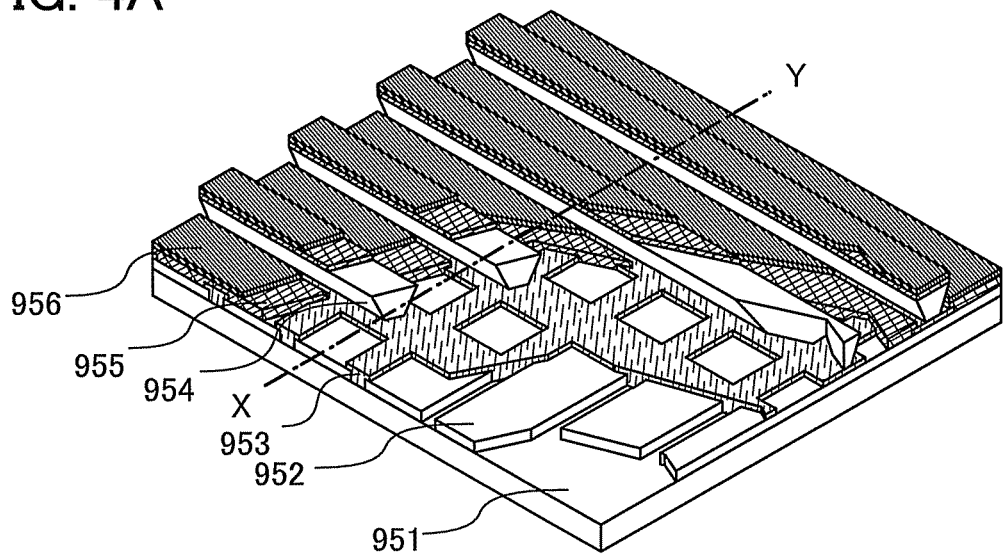
FIGS. 4A and 4B illustrate a light-emitting device according to one embodiment of the present invention.
Figure 4B:
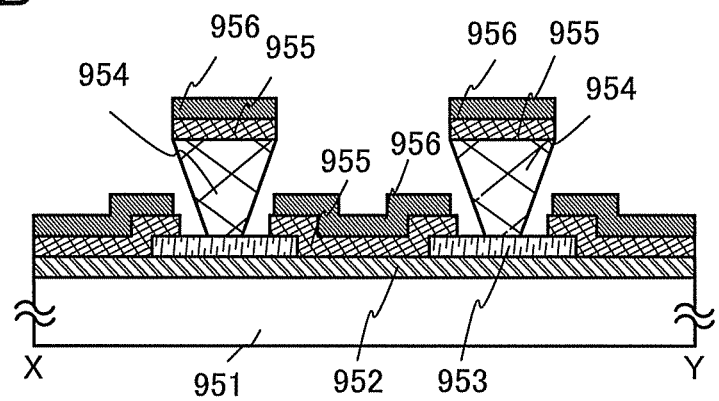

Although an example of an active matrix light-emitting device in which the driving of the light-emitting element is controlled by a transistor is described in this embodiment, a passive matrix light-emitting device may also be used. FIGS. 4A and 4B illustrate an example of a passive matrix light-emitting device manufactured using the light-emitting element described in Embodiment 1. FIG. 4A is a perspective view of the light-emitting device, and FIG. 4B is a cross-sectional view taken along line X-Y in FIG. 4A. In FIGS. 4A and 4B, an electrode 952 and an electrode 956 are provided over a substrate 951, and a layer 955 containing an organic compound is provided between the electrodes 952 and 956. An edge portion of the electrode 952 is covered with an insulating layer 953. A partition layer 954 is provided over the insulating layer 953. Sidewalls of the partition layer 954 are aslope such that the distance between the sidewalls is gradually narrowed toward the surface of the substrate. In other words, a cross section of the partition wall 954 in a short-side direction has a trapezoidal shape. By providing the partition layer 954 in this manner, defects of the light-emitting element due to static charge and the like can be prevented. Also in the passive matrix light-emitting device, the light-emitting element described in Embodiment 1 is included; thus, a high-definition light-emitting device having high display quality can be realized. Further, the light-emitting element described in Embodiment 1 has high current efficiency, can emit light with high luminance, and can realize suppression of crosstalk without great increase in driving voltage; therefore, the light-emitting device of this embodiment can be a light-emitting device having low driving voltage. Further, the light-emitting device of this embodiment can be a highly reliable light-emitting device having small degree of deterioration with driving time.

Further, for performing full color display, a coloring layer or a color conversion layer may be provided in a light path through which light from the light-emitting element passes to the outside of the light-emitting device. An example of a light-emitting device which realizes full color display with the use of a coloring layer is illustrated in FIGS. 5A and 5B. In FIG. 5A, a substrate 1001, a base insulating film 1002, a gate insulating film 1003, gate electrodes 1006 to 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition wall 1025, a layer 1028 containing an organic compound, a second electrode 1029 of the light-emitting elements, a sealing substrate 1031, and a sealant 1032 are illustrated. Further, coloring layers (a red coloring layer 1034R, a green coloring layer 1034G, and a blue coloring layer 1034B) are provided on a transparent base material 1033. Further, a black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In this embodiment, light emitted from some of the light-emitting layers does not pass through the coloring layers, while light emitted from the others of the light-emitting layers passes through the coloring layers. Since light which does not pass through the coloring layers is white and light which passes through any one of the coloring layers is red, blue, or green, an image can be displayed using pixels of the four colors.

Figure 6:
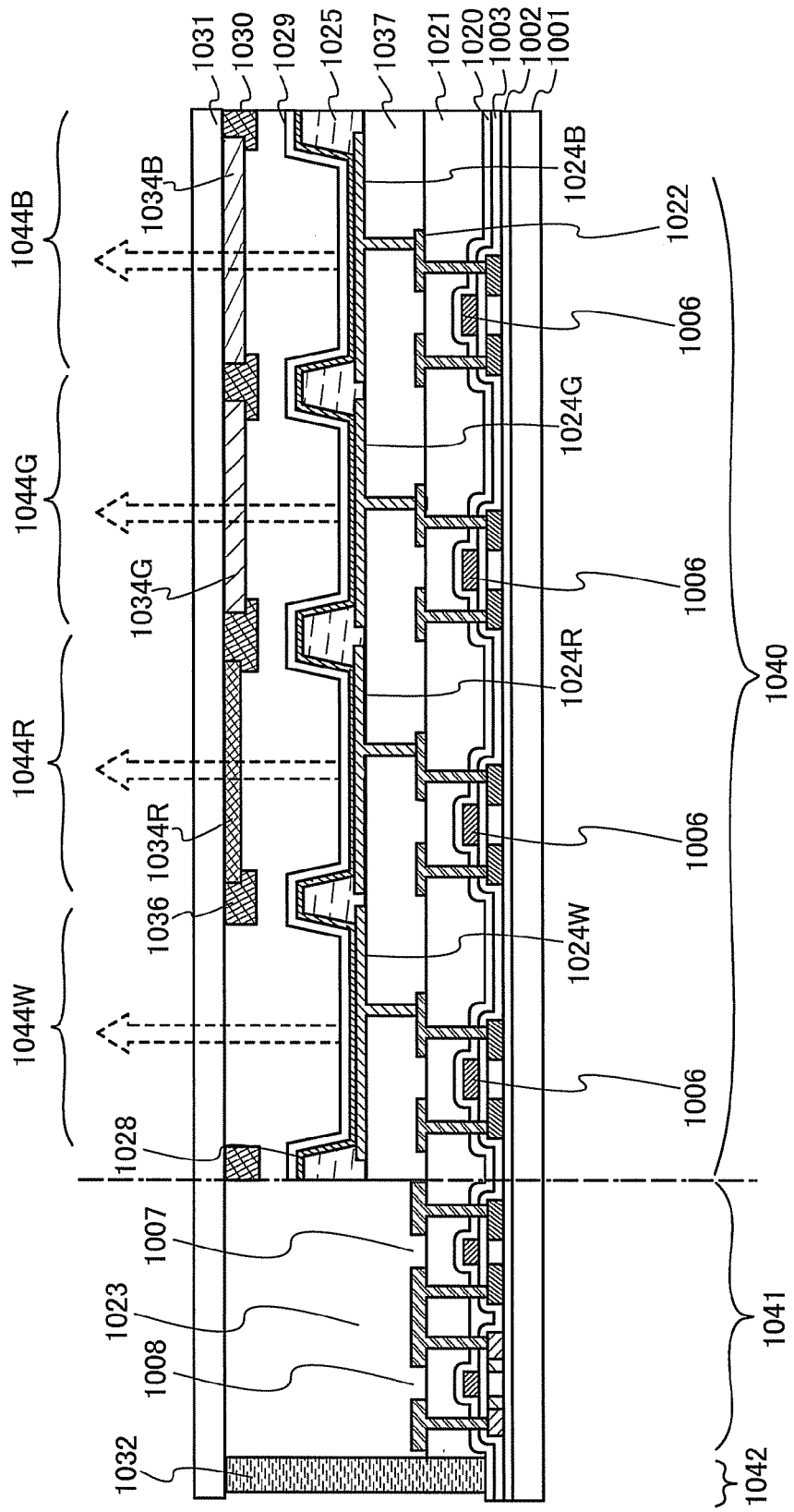
FIG. 6 illustrates a light-emitting device according to one embodiment of the present invention.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 6 is a cross-sectional view of a light-emitting device having a top emission structure. In this case, a substrate which does not transmit light can be used as the substrate 1001. The process up to the step of forming of a connection electrode which connects the TFT and the anode of the light-emitting element is performed in a manner similar to that of the light-emitting device having a bottom emission structure. Then, a third interlayer insulating film 1037 is formed to cover an electrode 1022. The third interlayer insulating film 1037 may have a planarization function. The third interlayer insulating film 1037 can be formed using a material similar to that of the second interlayer insulating film, and can alternatively be formed using any other known material.

The first electrodes 1024W, 1024R, 1024G, and 1024B of the light-emitting elements each serve as an anode here, but may serve as a cathode. Further, in the case of a light-emitting device having a top emission structure as illustrated in FIG. 6, the first electrodes are preferably reflective electrodes. The layer 1028 containing an organic compound is formed to have a structure similar to the structure described in Embodiment 1, with which white light emission can be obtained. As the structure with which white light emission can be obtained, in the case where two EL layers are used, a structure with which blue light is obtained from a light-emitting layer in one of the EL layers and orange light is obtained from a light-emitting layer of the other of the EL layers; a structure in which blue light is obtained from a light-emitting layer of one of the EL layers and red light and green light are obtained from a light-emitting layer of the other of the EL layers; and the like can be given. Further, in the case where three EL layers are used, red light, green light, and blue light are obtained from respective light-emitting layers, so that a light-emitting element which emits white light can be obtained. Needless to say, the structure with which white light emission is obtained is not limited thereto as long as the structure described in Embodiment 1 is used.

The coloring layers are each provided in a light path through which light from the light-emitting element passes to the outside of the light-emitting device. In the case of the light-emitting device having a bottom emission structure as illustrated in FIG. 5A, the coloring layers 1034R, 1034G, and 1034B can be provided on the transparent base material 1033 and then fixed to the substrate 1001. The coloring layers may be provided between the gate insulating film 1003 and the first interlayer insulating film 1020 as illustrated in FIG. 5B. In the case of a top emission structure as illustrated in FIG. 6, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) 1035 may be covered with the overcoat layer 1036. Note that a light-transmitting substrate is used as the sealing substrate 1031.

When voltage is applied between the pair of electrodes of the thus obtained organic light-emitting element, a white light-emitting region 1044W can be obtained. In addition, by using the coloring layers, a red light-emitting region 1044R, a blue light-emitting region 1044B, and a green light-emitting region 1044G can be obtained. The light-emitting device in this embodiment includes the light-emitting element described in Embodiment 1; thus, a high-definition light-emitting device having high display quality can be realized. Further, the light-emitting element described in Embodiment 1 has high current efficiency, can emit light with high luminance, and can realize suppression of crosstalk without great increase in driving voltage; therefore, the light-emitting device of this embodiment can be a light-emitting device having low driving voltage. Further, the light-emitting device of this embodiment can be a highly reliable light-emitting device having small degree of deterioration with driving time.

Further, although an example in which full color display is performed using four colors of red, green, blue, and white is shown here, there is no particular limitation and full color display using three colors of red, green, and blue may be performed.

This embodiment can be freely combined with Embodiment 1.

Embodiment 3

In this embodiment, examples of various electronic devices and lighting devices, which are completed using the light-emitting device of one embodiment of the present invention, such as described in Embodiment 2, will be described with reference to FIGS. 7A to 7D.

Examples of the electronic devices to which the light-emitting device is applied include television devices (also referred to as televisions or television receivers), monitors of computers or the like, cameras such as digital cameras or digital video cameras, digital photo frames, cellular phones (also referred to as mobile phones or cellular phone devices), portable game machines, portable information terminals, audio reproducing devices, large-sized game machines such as pachinko machines, and the like. Specific examples of these electronic devices are described below.

Figure 7A:
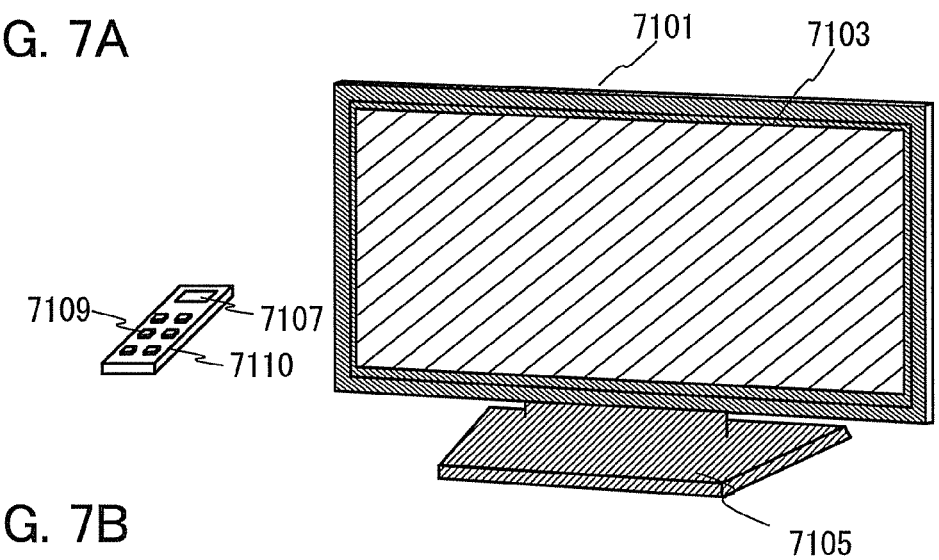
FIGS. 7A to 7D are examples of electronic devices according to one embodiment of the present invention.

FIG. 7A illustrates an example of a television device. In the television device, a display portion 7103 is incorporated in a housing 7101. Images can be displayed on the display portion 7103. The light-emitting device of one embodiment of the present invention, which is described in Embodiment 2, can be used for the display portion 7103. In addition, here, the housing 7101 is supported by a stand 7105. Such a television device including the display portion 7103 which has high display quality can provide high-quality images. Further, power consumption of the display portion 7103 can be reduced; thus, power consumption of the television device can be reduced.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 7B:
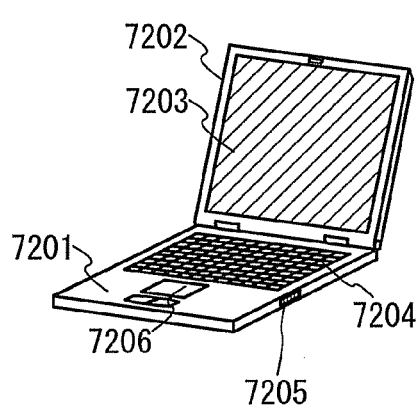

FIG. 7B illustrates a computer, which includes a main body 7201, a housing 7202, a display portion 7203, a keyboard 7204, an external connection port 7205, a pointing device 7206, and the like. This computer is manufactured using a light-emitting device according to one embodiment of the present invention, such as described in Embodiment 2, for the display portion 7203. Such a computer including the display portion 7203 which has high display quality can provide high-quality images. Further, power consumption of the display portion 7203 can be reduced; thus, power consumption of the computer can be reduced.

Figure 7C:
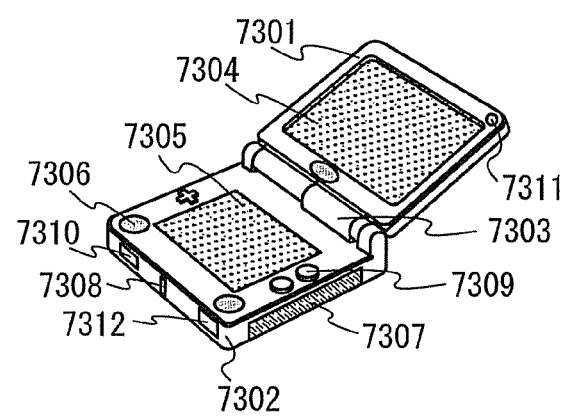

FIG. 7C illustrates a portable game machine, which includes two housings, a housing 7301 and a housing 7302, which are connected with a joint portion 7303 so that the portable game machine can be opened or folded. A display portion 7304 and a display portion 7305 each including a light-emitting element according to one embodiment of the present invention, such as described in Embodiment 2, are incorporated in the housing 7301 and the housing 7302, respectively. In addition, the portable game machine illustrated in FIG. 7C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 7312), and the like. It is needless to say that the structure of the portable game machine is not limited to the above as long as the light-emitting device is used for at least either the display portion 7304 or the display portion 7305, or both, and may include other accessories as appropriate. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above. A portable game machine including the display portion 7304 which has high display quality can provide high-quality images. Further, power consumption of the display portion 7304 can be reduced; thus, power consumption of the portable game machine can be reduced.

Figure 7D:
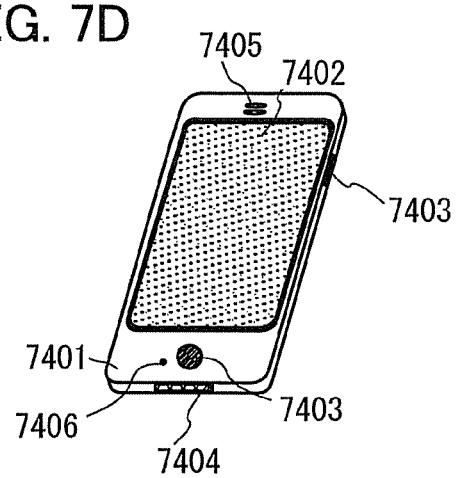

FIG. 7D illustrates an example of a cellular phone. The cellular phone is provided with a display portion 7402 incorporated in a housing 7401, operation buttons 7403, an external connection port 7404, a speaker 7405, a microphone 7406, and the like. The cellular phone is manufactured using a light-emitting device according to one embodiment of the present invention, such as described in Embodiment 2, for the display portion 7402. Such a cellular phone including the display portion 7402 which has high display quality can provide high-quality images. Further, power consumption of the display portion 7402 can be reduced; thus, power consumption of the cellular phone can be reduced.

When the display portion 7402 of the cellular phone illustrated in FIG. 7D is touched with a finger or the like, data can be input into the cellular phone. In this case, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or creating e-mail, a text input mode mainly for inputting text is selected for the display portion 7402 so that text displayed on a screen can be input. In that case, it is preferable to display a keyboard or number buttons on almost all the area of the screen of the display portion 7402.

When a detection device which includes a sensor for detecting inclination, such as a gyroscope or an acceleration sensor, is provided inside the cellular phone, the direction of the cellular phone (whether the cellular phone is placed horizontally or vertically for a landscape mode or a portrait mode) is determined so that display on the screen of the display portion 7402 can be automatically switched.

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 can also function as an image sensor. For example, an image of a palm print, a fingerprint, or the like is taken by touch on the display portion 7402 with the palm or the finger, whereby personal authentication can be performed. Further, by providing a backlight or a sensing light source which emits near-infrared light in the display portion, an image of a finger vein, a palm vein, or the like can be taken.

As described above, an electronic device including the light-emitting device described in Embodiment 2 can be obtained. Thus, the application range of the light-emitting device described in Embodiment 2 is so wide that the light-emitting device can be applied to electronic appliances of a variety of fields.

Note that the structure described in this embodiment can be combined with the structure described in Embodiment 1 or 2 as appropriate.

Example 1

Light-Emitting Element

Figure 8:
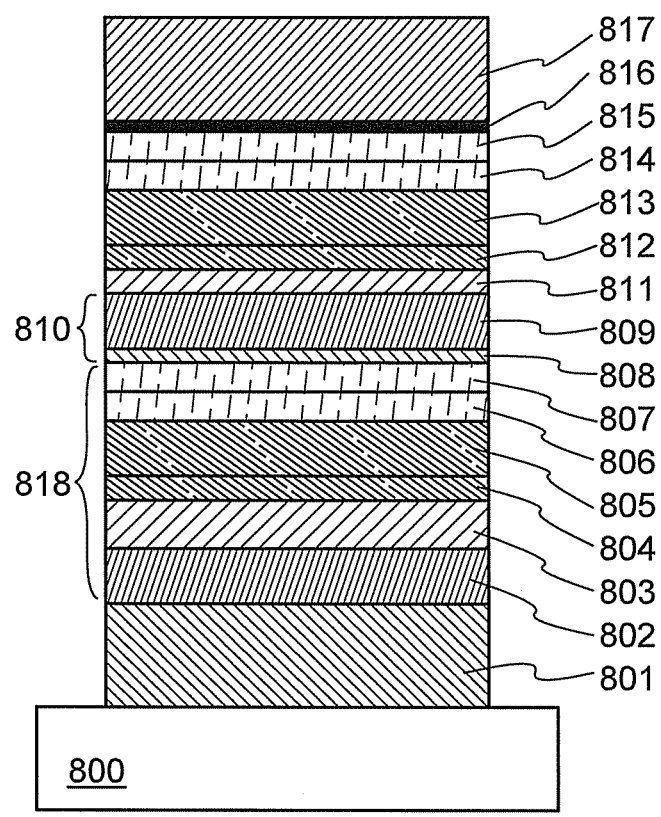
FIG. 8 illustrates a structure of a light-emitting element according to one embodiment of the present invention.

In this example, the light-emitting element of one embodiment of the present invention, which is described in Embodiment 1, will be described with reference to FIG. 8. Chemical formulae of materials used in this example are shown below.

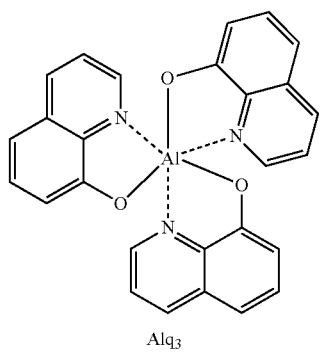

Alq$_3$

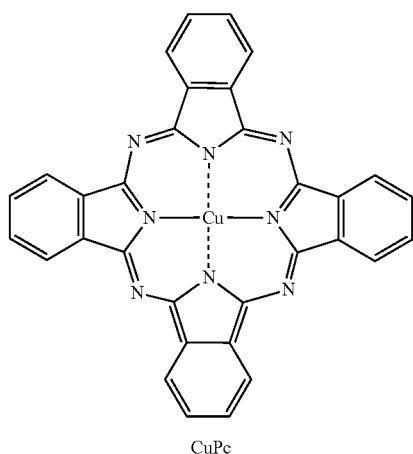

CuPc

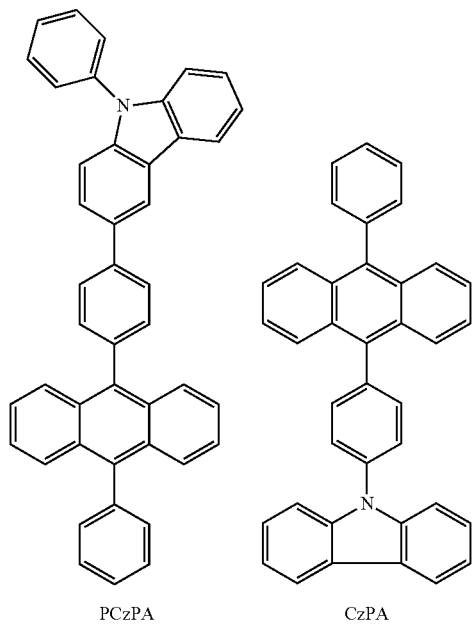

PCzPA    CzPA

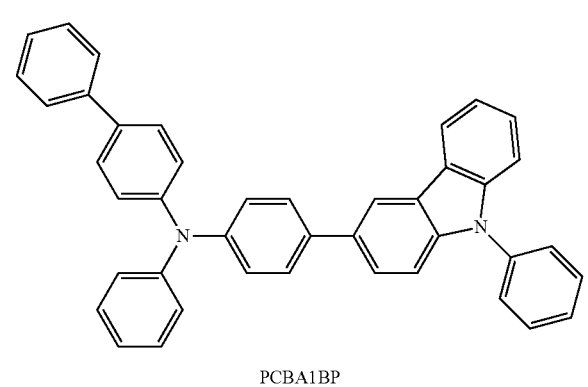

PCBA1BP

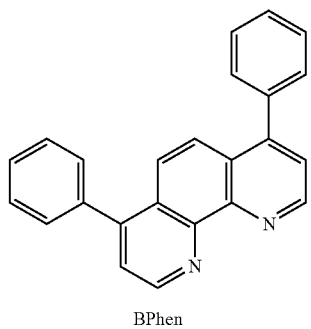

BPhen

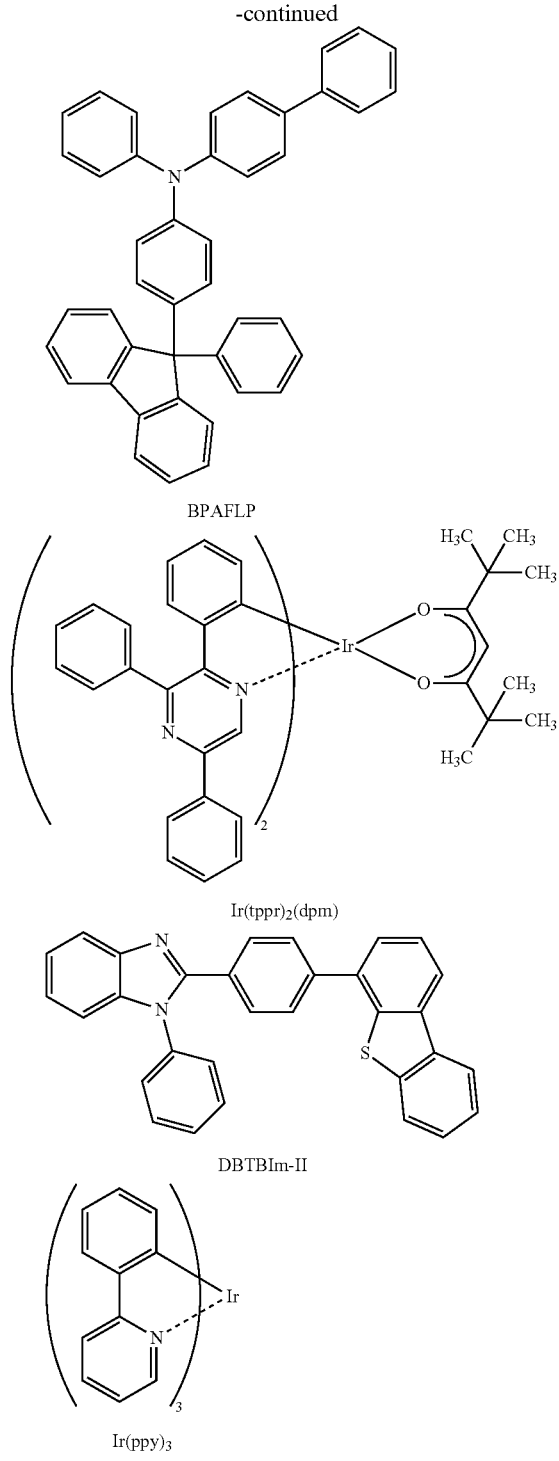

BPAFLP

Ir(tppr)₂(dpm)

DBTBIm-II

Ir(ppy)₃

A method for manufacturing a light-emitting element 1 of this example will be described below.

First, indium tin oxide containing silicon or silicon oxide was deposited to a thickness of 110 nm over a glass substrate 800 by a sputtering method. A surface thereof was covered with a polyimide film so that an area of 2 mm×2 mm of the surface was exposed. Thus, a first electrode 801 was formed and the electrode area was 2 mm×2 mm.

As a pretreatment for forming the light-emitting element over the substrate, after the surface of the substrate was washed with water and baking was performed at 200° C. for one hour, UV ozone treatment was performed for 370 seconds. Then, the substrate was transferred into a vacuum deposition apparatus whose pressure was reduced to approximately $10^{-4}$ Pa, and vacuum baking at 170° C. for 30 minutes was performed in a heating chamber of the vacuum deposition apparatus. After that, the substrate was cooled down for approximately 30 minutes.

Next, a first charge generation layer 802 was formed to a thickness of 50 nm in the following manner: the substrate provided with the first electrode 801 was fixed to a substrate holder in the vacuum deposition apparatus so that a surface of the substrate on which the first electrode 801 was formed faced downward, the pressure in the vacuum deposition apparatus was reduced to approximately $10^{-4}$ Pa, and then 9-[4-(9-phenylcarbazol-3-yl)]phenyl-10-phenylanthracene (abbreviation: PCzPA), and molybdenum(VI) oxide were co-deposited. The weight ratio of PCzPA to molybdenum(VI) oxide was adjusted to be 2:1 (=PCzPA:molybdenum oxide). Note that a co-deposition method refers to a deposition method in which deposition is carried out from a plurality of evaporation sources at the same time in one treatment chamber.

Next, PCzPA was deposited to a thickness of 30 nm by a deposition method using resistance heating to form a first hole transport layer 803.

After that, PCzPA and SD1 (product name; manufactured by SFC Co., Ltd) were co-deposited to form a first light-emitting layer 804 having a thickness of 10 nm. Here, the weight ratio of PCzPA to SD1 was adjusted to be 1:0.05 (=PCzPA:SD1). Next, 9-[4-(10-phenyl-9-anthryl)phenyl]-9H-carbazole (abbreviation: CzPA) and SD1 were co-deposited to form a second light-emitting layer 805 having a thickness of 25 nm. Here, the weight ratio of CzPA to SD1 was adjusted to be 1:0.05 (=CzPA:SD1). Both the first light-emitting layer 804 and the second light-emitting layer 805 contained SD1 which is a blue fluorescent substance and emitted blue light.

After the second light-emitting layer 805 was formed, tris(8-quinolinolato)aluminum (abbreviation: Alq₃) was deposited to a thickness of 10 nm to form a first electron transport layer 806, and then bathophenanthroline (abbreviation: BPhen) was deposited to a thickness of 15 nm to form a second electron transport layer 807.

After that, calcium was formed to a thickness of 1 nm.

Then, copper phthalocyanine (abbreviation: CuPc) was formed to a thickness of 2 nm to form a second layer 808 which was an electron relay layer, and 4-phenyl-4'-(9-phenylfluoren-9-yl)triphenylamine (abbreviation: BPAFLP) and molybdenum oxide were co-deposited to form a first layer 809 which was a second charge generation layer; thus, an intermediate layer 810 was formed. The first layer 809 was formed to a thickness of 50 nm, and the weight ratio of BPAFLP to molybdenum(VI) oxide was adjusted to be 2:1 (=BPAFLP:molybdenum oxide).

Note that calcium is dispersed in an organic compound. Therefore, calcium was dispersed in the second electron transport layer 807 and a concentration gradient of calcium in the second electron transport layer 807 was such that the concentration of calcium became lower from an interface between the second layer 808 and the second electron transport layer 807 to the first electrode 801.

After the intermediate layer 810 was formed, 4-phenyl-4'-(9-phenyl-9H-carbazol-3-yl)triphenylamine (abbreviation: PCBA1BP) was evaporated to a thickness of 10 nm to form a second hole transport layer 811.

After that, PCBA1BP and (dipivaloylmethanato)bis(2,3,5-triphenylpyrazinato)iridium(III) (abbreviation: Ir(tppr)$_2$(dpm)) were co-evaporated to form a third light-emitting layer 812 having a thickness of 10 nm. Here, the weight ratio of PCBA1BP to Ir(tppr)$_2$(dpm) was adjusted to be 1:0.05 (=PCBA1BP:Ir(tppr)$_2$(dpm)). Next, 2-[4-(dibenzothiophen-4-yl)phenyl]-1-phenyl-1H-benzimidazole (abbreviation: DBTBIm-II), PCBA1BP, and tris(2-phenylpyridinato-N,C$^{2'}$)iridium(III) (abbreviation: Ir(ppy)$_3$) were co-evaporated to form a fourth light-emitting layer 813 having a thickness of 30 mm Here, the weight ratio of DBTBIm-II to PCBA1BP and Ir(ppy)$_3$ was adjusted to be 1:0.1:0.08 (=DBTBIm-II:PCBA1BP:Ir(ppy)$_3$). Here, the third light-emitting layer 812 contained Ir(tppr)$_2$(dpm) which is a red phosphorescent substance and emitted red light. Further, the fourth light-emitting layer 813 contained Ir(ppy)$_3$ which is a green phosphorescent substance and emitted green light.

After the fourth light-emitting layer 813 was formed, DBTBIm-II was deposited to a thickness of 15 nm and then BPhen was deposited to a thickness of 15 nm to form a third electron transport layer 814 and a fourth electron transport layer 815. After that, lithium fluoride was deposited to a thickness of 1 nm as an electron injection layer 816. Finally, aluminum was deposited to a thickness of 200 nm to form a second electrode 817; thus, the light-emitting element 1 was manufactured.

A light-emitting element 2 was manufactured in such a manner that CzPA was used instead of Alq$_3$ in the first electron transport layer 806 in the light-emitting element 1.

The light-emitting element 1 and the light-emitting element 2 thus obtained were sealed in a glove box under a nitrogen atmosphere without being exposed to the air. Then, the operating characteristics of the light-emitting elements were measured. Note that the measurement was carried out at room temperature (in an atmosphere kept at 25° C.).

Figure 9:
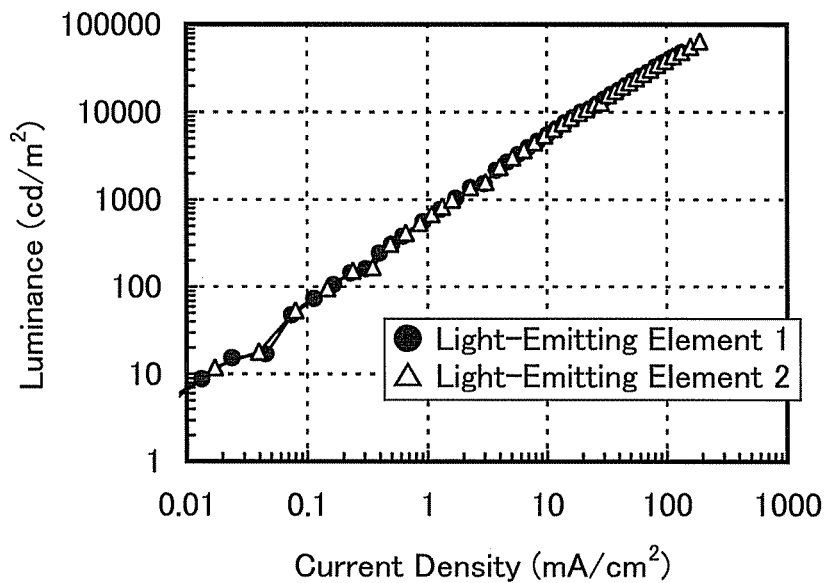
FIG. 9 is a graph showing current density vs. luminance characteristics of a light-emitting element 1 and a light-emitting element 2.
Figure 10:
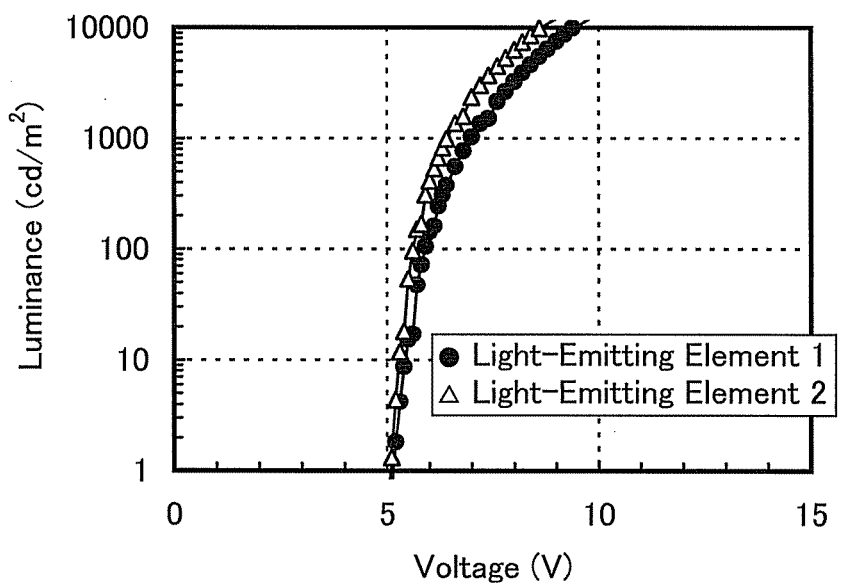
FIG. 10 is a graph showing voltage vs. luminance characteristics of the light-emitting element 1 and the light-emitting element 2.
Figure 11:
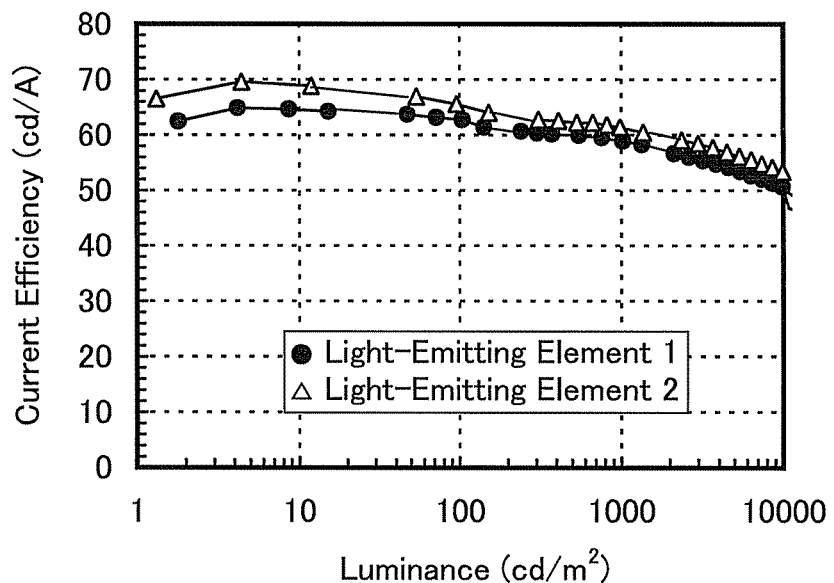
FIG. 11 is a graph showing luminance vs. current efficiency characteristics of the light-emitting element 1 and the light-emitting element 2.
Figure 12:
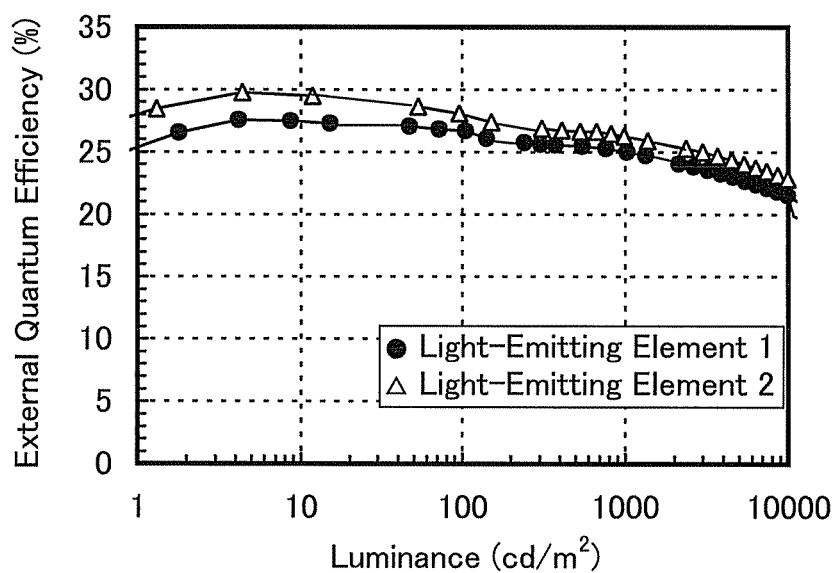
FIG. 12 is a graph showing luminance vs. external quantum efficiency characteristics of the light-emitting element 1 and the light-emitting element 2.
Figure 13:
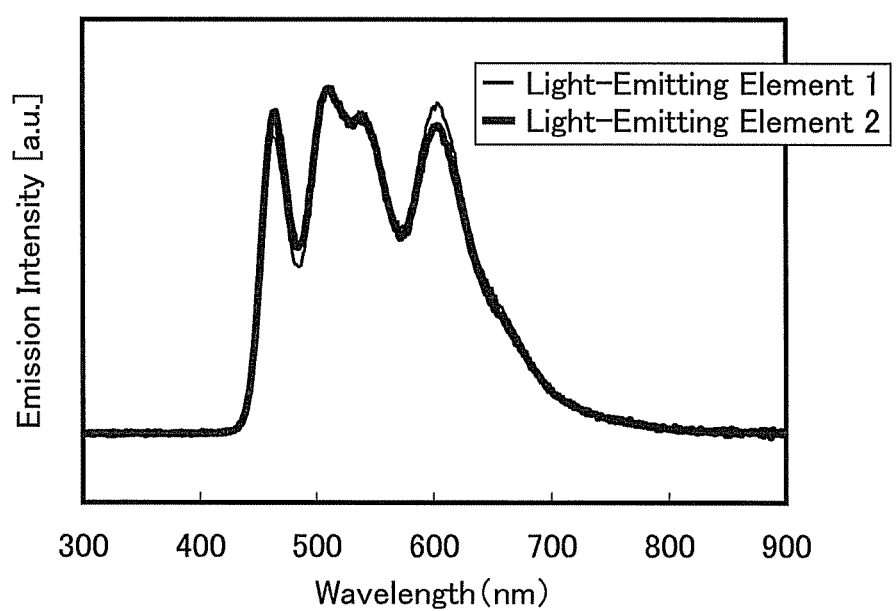
FIG. 13 is a graph showing emission spectra of the light-emitting element 1 and the light-emitting element 2.

FIG. 9 shows current density vs. luminance characteristics of the light-emitting element 1 and the light-emitting element 2. FIG. 10 shows voltage vs. luminance characteristics of the light-emitting element 1 and the light-emitting element 2. FIG. 11 shows luminance vs. current efficiency characteristics of the light-emitting element 1 and the light-emitting element 2. FIG. 12 shows luminance vs. external quantum efficiency characteristics of the light-emitting element 1 and the light-emitting element 2. FIG. 13 shows emission spectra when a current of 1 mA flows through the light-emitting element 1 and the light-emitting element 2.

As shown in FIG. 11 and FIG. 12, the current efficiency and external quantum efficiency of the light-emitting element 1 at around 1000 cd/m$^2$ were 58.8 cd/A and 25.0%, respectively, and the current efficiency and external quantum efficiency of the light-emitting element 2 at around 1000 cd/m$^2$ were 61.4 cd/A and 26.3%, respectively, which were extremely high efficiencies. Thus, it can be found that the light-emitting element 1 and the light-emitting element 2 which have the structure described in Embodiment 1 are light-emitting elements which can emit light with extremely high emission efficiency. Further, it can be found from FIG. 9 that the current density for obtaining luminance at around 1000 cd/m$^2$ was 1.75 mA/cm$^2$ for the light-emitting element 1 and 1.61 mA/cm$^2$ for the light-emitting element 2, showing that high luminance was obtained with extremely low current density.

Further, as shown in FIG. 10, the light-emitting element 1 and the light-emitting element 2 can be driven at 6 V to 7 V to obtain luminance at around 1000 cd/m$^2$, while a light-emitting element disclosed in Patent Document 1 has a driving voltage of approximately 12 V at around 1000 cd/m$^2$. This indicates that the light-emitting element 1 and the light-emitting element 2 are light-emitting elements capable of driving at low voltage.

Furthermore, it can be found from FIG. 13 that the light-emitting element 1 and the light-emitting element 2 exhibit balanced emission peaks of red, green, and blue, and that the light-emitting element 1 and the light-emitting element 2 can be suitably used for display application with a color filter.

(Verification of Crosstalk)

Next, high-definition displays were manufactured using a plurality of light-emitting elements having structures similar to those of the light-emitting element 1 and the light-emitting element 2, in which a distance between light-emitting regions in pixels having different colors was approximately 8 μm, and verification results whether crosstalk occurs are shown.

Figure 14W:
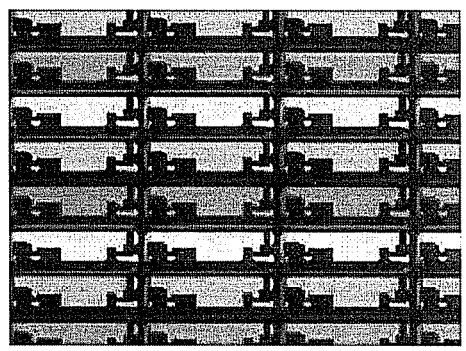
FIGS. 14W, 14R, 14G, and 14B are optical micrographs of a display (display 1) including the light-emitting element 1.
Figure 14R:
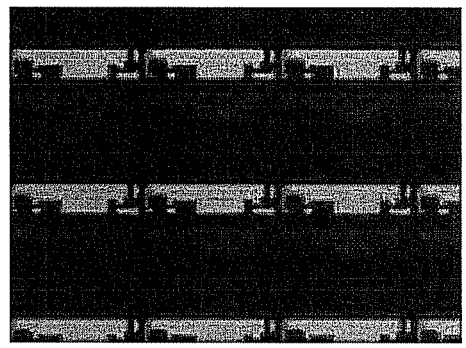
Figure 14G:
Figure 14B:
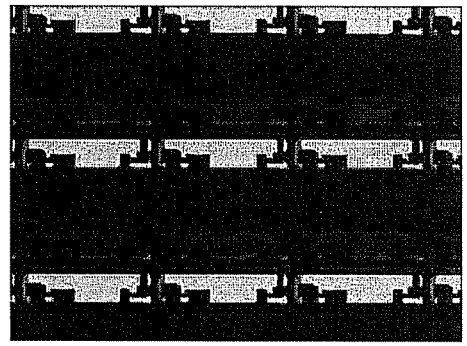
Figure 15W:
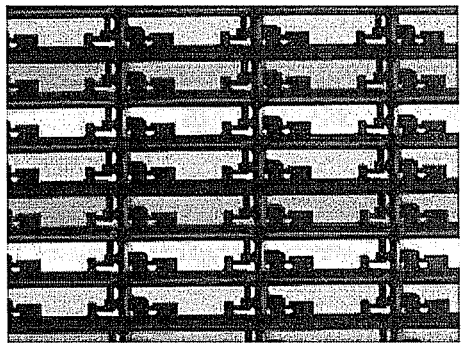
FIGS. 15W, 15R, 15G, and 15B are optical micrographs of a display (display 2) including the light-emitting element 2.
Figure 15R:
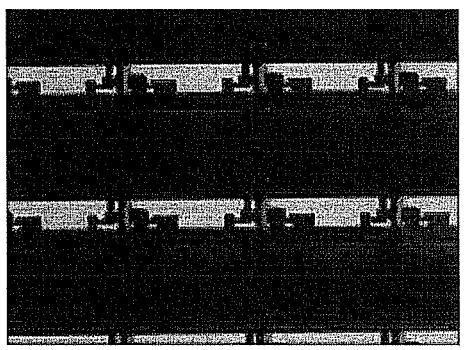
Figure 15G:
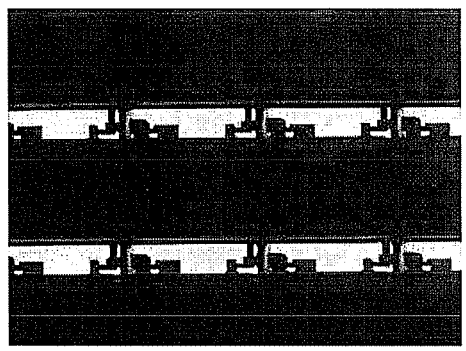
Figure 15B:
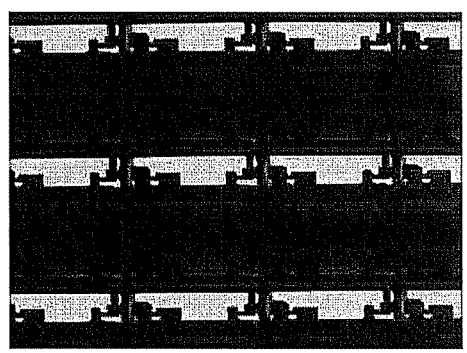

FIGS. 14W, 14R, 14Q and 14B show optical micrographs of a display (a display 1) which includes light-emitting elements having a structure similar to that of the light-emitting element 1. FIG. 14W is the micrograph at the time when all the pixels are made to emit light, in which a distance between light-emitting regions of adjacent pixels exhibiting different colors is approximately 4 μm. FIGS. 14R, 14G, and 14B show results each in which only red elements, green elements, or blue elements are made to emit light. FIGS. 15W, 15R, 15Q and 15B show optical micrographs of a display (a display 2) which includes light-emitting elements having a structure similar to that of the light-emitting element 2. FIG. 15W is the micrograph at the time when all the pixels are made to emit light, in which a distance between light-emitting regions of adjacent pixels exhibiting different colors is approximately 4 μm. FIGS. 15R, 15G, and 15B show results each in which only red elements, green elements, or blue elements are made to emit light. Note that each of the two displays is one embodiment of the present invention.

Figure 16W:
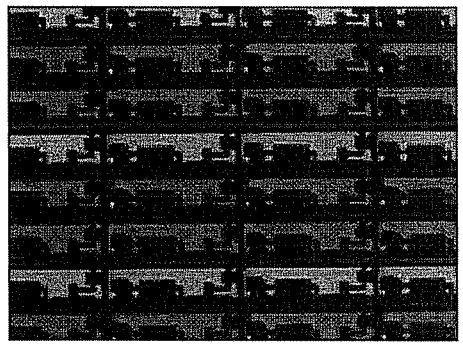
FIGS. 16W, 16R, 16G, and 16B are optical micrographs of a display (display 3) including a comparative light-emitting element 1.
Figure 16R:
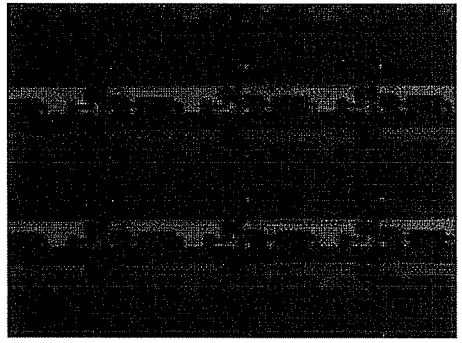
Figure 16G:
Figure 16B:
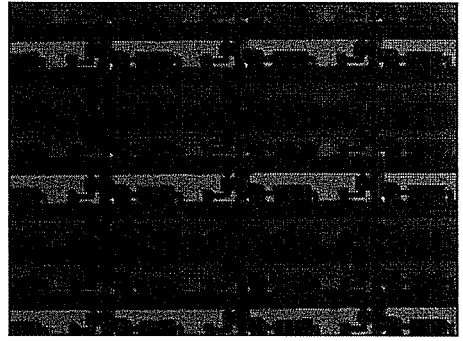

FIGS. 16W, 16R, 16G, and 16B show optical micrographs of a display (a display 3) which was manufactured using a plurality of comparative light-emitting elements 1 having a structure substantially the same as that of the light-emitting element 1. The comparative light-emitting element 1 is a light-emitting element in which lithium oxide (Li$_2$O) was deposited to a thickness of 0.1 nm instead of depositing calcium to a thickness of 1 nm in the method for manufacturing the light-emitting element 1. FIG. 16W is the micrograph at the time when all the pixels are made to emit light, and FIGS. 16R, 16Q and 16B show results each in which only red pixels, green pixels, or blue pixels are made to emit light. Note that the structure of the display 3 is similar to that of the other displays.

Figure 22A:
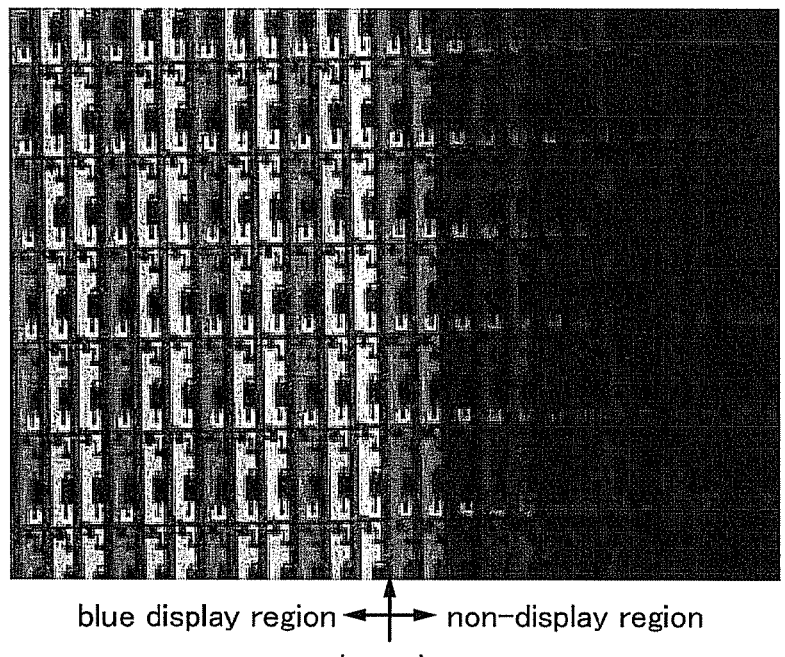
FIGS. 22A and 22B are optical micrographs of a display (display 4) including a comparative light-emitting element 2.
Figure 22B:
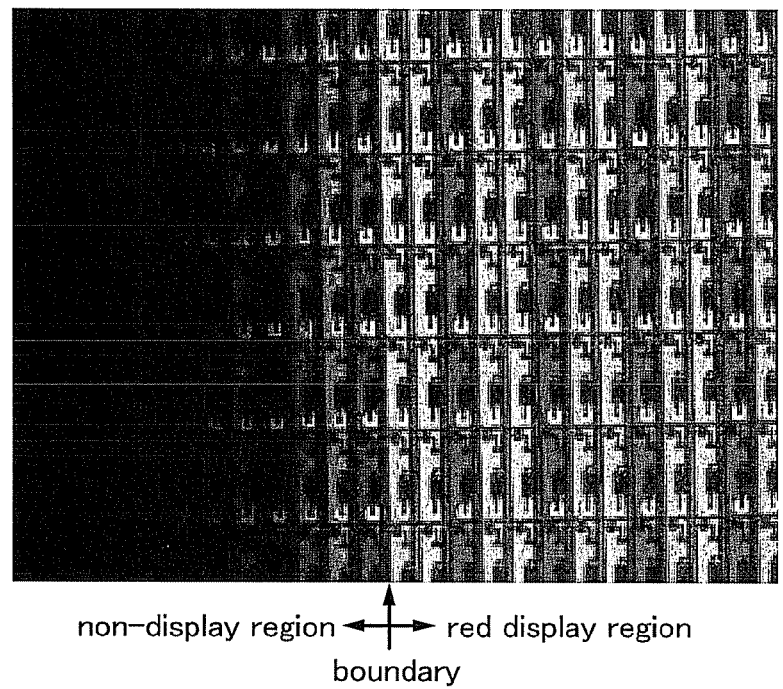

FIGS. 22A and 22B show optical micrographs of a display (a display 4) which was manufactured using a plurality of comparative light-emitting elements 2 having a structure substantially the same as that of the light-emitting element 1. The comparative light-emitting element 2 is a light-emitting element in which BPhen was formed to a thickness of 10 nm as the first electron transport layer 806 and a co-deposited film of BPhen and Li (BPhen:Li=1:0.02 at the weight ratio) was formed to a thickness of 20 nm as the second electron transport layer 807, instead of forming the first electron transport layer 806, the second electron transport layer 807, and the second layer 808 serving as an electron relay layer in the method for manufacturing the light-emitting element 1. In FIG. 22A, a left half of the micrograph is a blue display region in which only blue pixels emit light and a right half thereof is a non-display region in which no pixel emits light. A boundary between the non-display region and the blue display region is located in a position shown in FIG. 22A. In FIG. 22B, a left half of the micrograph is a non-display region in which no pixel emits light and a right half thereof is a red display region in which only red pixels emit light. A boundary between the non-display region and the red display region is located in a position shown in FIG. 22B.

As shown in FIGS. 16W, 16R, 16G, and 16B, in the display (the display 3) which includes the comparative light-emitting elements 1 including lithium oxide that is an oxide of an alkali metal instead of calcium that is an alkaline earth metal, it is found that elements having different colors, which are adjacent to a selected line, also emit light. In particular, in FIG. 16B in which only blue pixels are made to emit light, red pixels also emit light in all light-emitting regions though it is dark light. A pitch (a distance from a side of one pixel to a side in the same position of an adjacent pixel) between pixels in a short-side direction of the display is 26 µm and the distance between light-emitting regions is 8 µm, so that in the display 3, it can be said that crosstalk occurs over a region of at least 8 µm+26 µm+αµm and that crosstalk might occur even when a distance between light-emitting regions is approximately 40 µm. Needless to say, crosstalk certainly occurs when a distance between light-emitting regions is 30 µm.

As shown in FIGS. 22A and 22B, in the display (the display 4) which includes the comparative light-emitting elements including a film in which BPhen is doped with lithium that is an alkali metal instead of calcium that is an alkaline earth metal, even in a region where only blue line is made to emit light, a red line and a green line also emit light at substantially the same level as the blue line; even in the red display region, a green line also emits light at substantially the same level as the red line; and some elements emit light even in a non-display region. In particular, in the display 4, it is confirmed that not only a pixel adjacent to a selected pixel but also a pixel adjacent thereto and a further pixel emit light.

As shown in FIGS. 14W, 14R, 14G, and 14B and FIGS. 15W, 15R, 15G, and 15B, it is found that such crosstalk is effectively reduced in the display 1 and the display 2 each of which is one embodiment of the present invention. The distance between the light-emitting regions is 8 µm and outlines of the pixels are clear; accordingly, generation of crosstalk can be suppressed with a distance between light-emitting regions of 3 µm, or 5 µm with a margin, in a display to which the present invention is applied.

Figure 17:
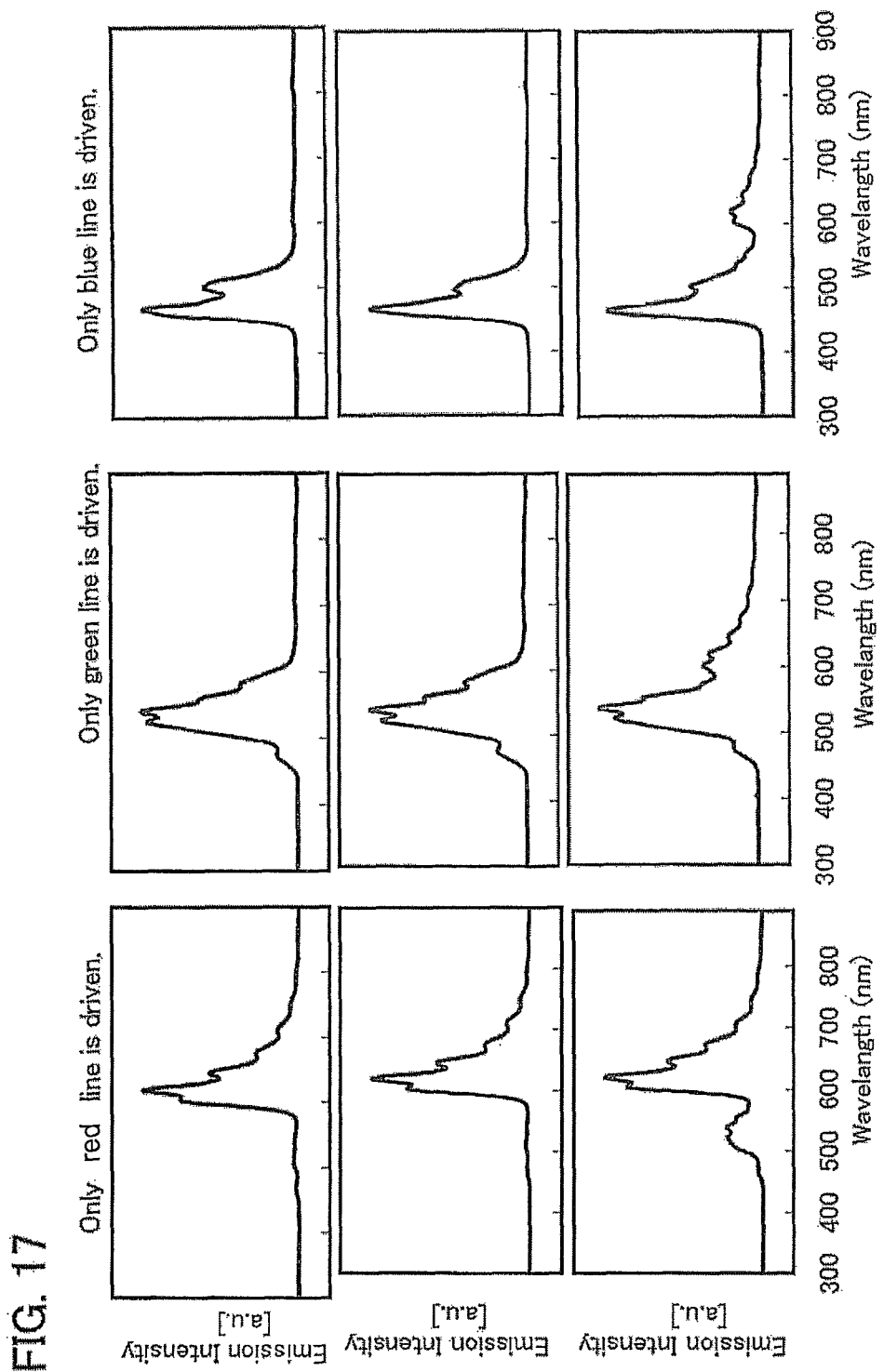
FIG. 17 shows emission spectra of the display 1 (in an top row), the display 2 (in a middle row), and the display 3 (in a bottom row)

Next, FIG. 17 shows emission spectra when the light-emitting elements in a red line, light-emitting elements in a green line, and light-emitting elements in a blue line are driven in the displays 1 to 3. In FIG. 17, the spectra of the display 1 are in a top row, the spectra of the display 2 are in a middle row, and the spectra of the display 3 are in a bottom row. As shown in FIG. 17, a peak of a color of a line other than the selected line is clearly observed only in the display 3 which includes the comparative light-emitting elements 1 and is a comparative example, indicating that crosstalk occurs.

Thus, in the displays which includes the light-emitting elements 1 and the light-emitting elements 2 each of which is one embodiment of the present invention, crosstalk to an adjacent pixel is suppressed even when the distance between light-emitting regions is as extremely small as approximately 4 µm; thus, it can be found that the light-emitting element 1 and the light-emitting element 2 are light-emitting elements which can provide a high-quality image.

As described above, the light-emitting element 1 and the light-emitting element 2 each of which is one embodiment of the present invention are light-emitting elements which have structures in which a plurality of EL layers is separated from each other by a charge generation layer. With the use of the light-emitting elements, crosstalk can be suppressed even in a high-definition display without great increase in driving voltage. Further, the light-emitting elements have high current efficiency and light emission with high luminance is possible.

Further, it can be found that the display 1 and the display 2 each of which is one embodiment of the present invention are high-definition displays in which crosstalk between adjacent pixels is suppressed without great increase in driving voltage. The display 1 and the display 2 having such characteristics can be displays having high display quality.

Reference Example 1

As a reference example, a verification result of change in characteristics of a light-emitting element depending on presence of an electron relay layer is shown. This verification result is a reference example because this is not verification in a light-emitting element satisfying all the structure of the present invention. However, it can be easily understood by those skilled in the art that the verification result is sufficiently applicable to a light-emitting element having the structure of the present invention.

Figure 18:
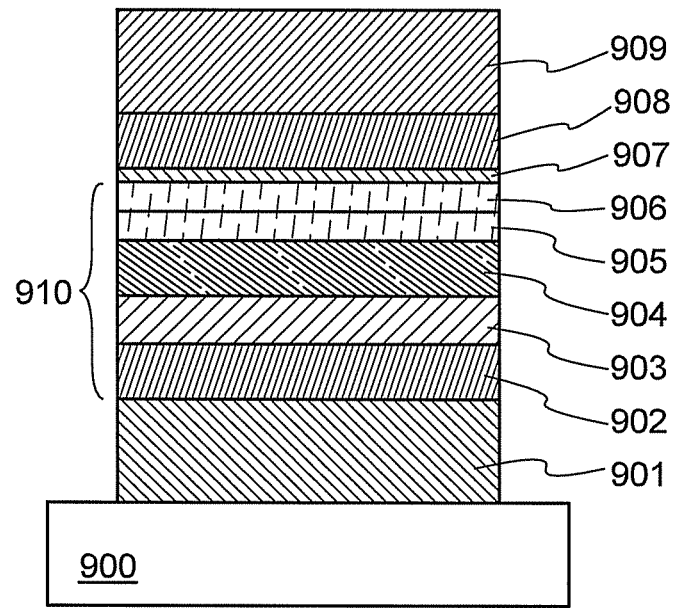
FIG. 18 illustrates a structure of a light-emitting element according to one embodiment of the present invention.

In this reference example, an advantageous effect of presence of an electron relay layer in a light-emitting element having a structure illustrated in FIG. 18 will be described. The chemical formulae of materials used in this reference example are illustrated below.

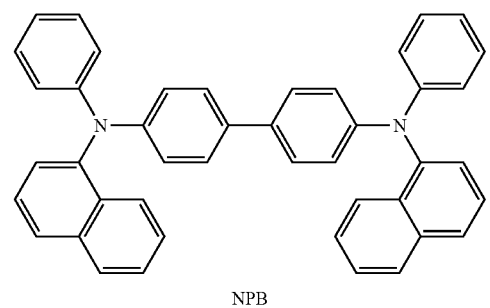

NPB

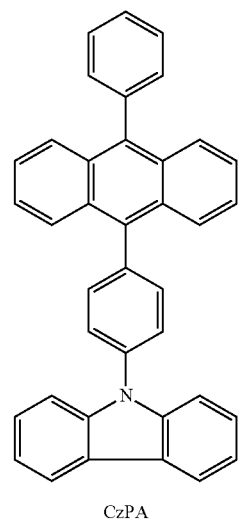

CzPA

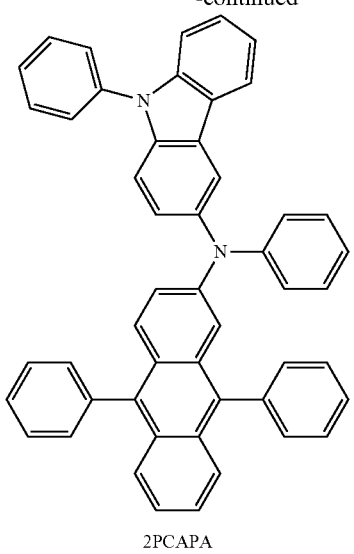

2PCAPA

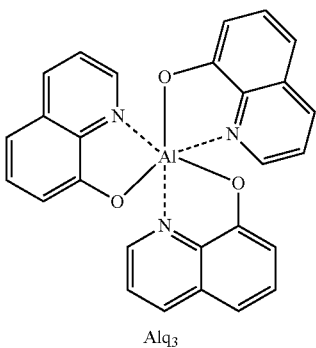

Alq₃

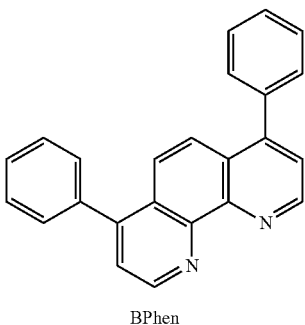

BPhen

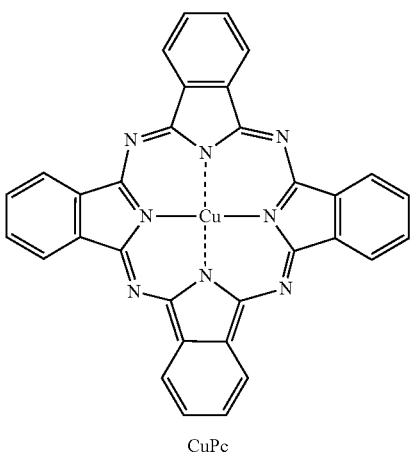

CuPc

Methods for manufacturing a light-emitting element 3 and a light-emitting element 4 of this reference example will be described below.

First, indium tin oxide containing silicon or silicon oxide was deposited to a thickness of 110 nm over a glass substrate 900 by a sputtering method. A surface thereof was covered with a polyimide film so that an area of 2 mm×2 mm of the surface was exposed. Thus, a first electrode 901 was formed and the electrode area was 2 mm×2 mm.

As a pretreatment for forming the light-emitting element over the substrate, after the surface of the substrate was washed with water and baking was performed at 200° C. for one hour, UV ozone treatment was performed for 370 seconds. Then, the substrate was transferred into a vacuum deposition apparatus whose pressure was reduced to approximately 10−4 Pa, and vacuum baking at 170° C. for 30 minutes was performed in a heating chamber of the vacuum deposition apparatus. After that, the substrate was cooled down for approximately 30 minutes.

Next, a first charge generation layer 902 was formed to a thickness of 50 nm in the following manner: the substrate provided with the first electrode 901 was fixed to a substrate holder in the vacuum deposition apparatus so that a surface of the substrate on which the first electrode 901 was formed faced downward, the pressure in the vacuum deposition apparatus was reduced to approximately $10^{-4}$ Pa, and then 4,4'-bis [N-(1-naphthyl)-N-phenylamino]biphenyl (abbreviation: NPB) and molybdenum(VI) oxide were co-deposited. The weight ratio of NPB to molybdenum(VI) oxide was adjusted to be 4:1 (=NPB:molybdenum oxide). Note that a co-deposition method refers to a deposition method in which deposition is carried out from a plurality of evaporation sources at the same time in one treatment chamber.

Next, NPB was deposited to a thickness of 30 nm by a deposition method using resistance heating to form a hole transport layer 903.

After that, a light-emitting layer 904 was formed to a thickness of 30 nm by co-deposition of 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA). Here, the weight ratio of CzPA to 2PCAPA was adjusted to be 1:0.05 (=CzPA: 2PCAPA).

After the light-emitting layer 904 was formed, tris(8-quinolinolato)aluminum (abbreviation: Alq₃) was deposited to a thickness of 10 nm to form a first electron transport layer 905 and then bathophenanthroline (abbreviation: BPhen) was deposited to a thickness of 10 nm to form a second electron transport layer 906.

After that, calcium was formed to a thickness of 1 nm.

Then, copper phthalocyanine (abbreviation: CuPc) was formed to a thickness of 2 nm to form a second layer 907 which was an electron relay layer and NPB and molybdenum oxide were co-evaporated to form a first layer 908 which was a second charge generation layer. The thickness of the first layer 908 was 20 nm, and the weight ratio of NPB to molybdenum(VI) oxide was adjusted to be 4:1 (=NPB:molybdenum oxide).

Note that calcium is dispersed in an organic compound. Therefore, calcium was dispersed in the second electron transport layer 906 and a concentration gradient of calcium in the second electron transport layer 906 was such that the concentration of calcium became lower from an interface between the second layer 907 and the second electron transport layer 906 to the first electrode 901.

Finally, aluminum was deposited to a thickness of 200 nm to form a second electrode 909; thus, the light-emitting element 3 was manufactured.

The light-emitting element 4 has substantially the same structure as the light-emitting element 3. The light-emitting element 4 is a light-emitting element in which a second layer that is an electron relay layer was not formed.

Figure 19:
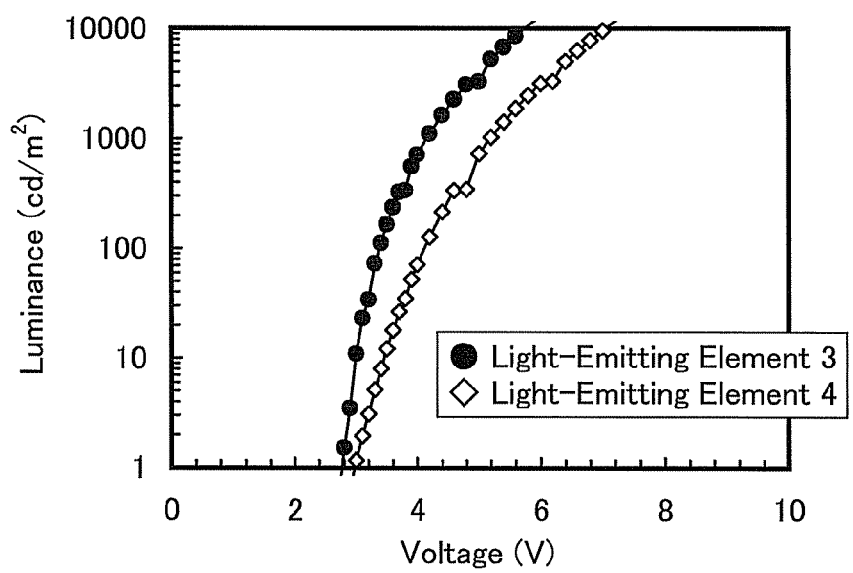
FIG. 19 is a graph showing voltage vs. luminance characteristics of a light-emitting element 3 and a light-emitting element 4.
Figure 20:
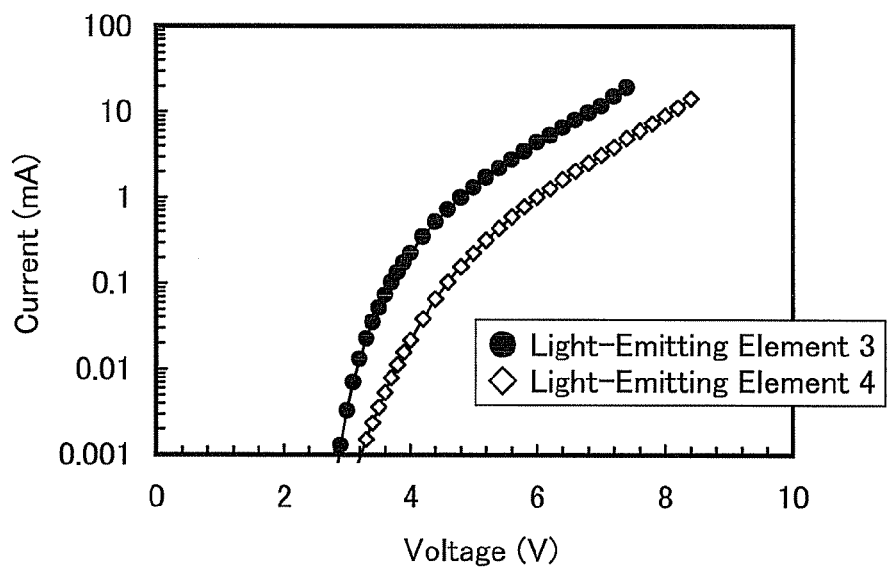
FIG. 20 is a graph showing voltage vs. current characteristics of the light-emitting element 3 and the light-emitting element 4.
Figure 21:
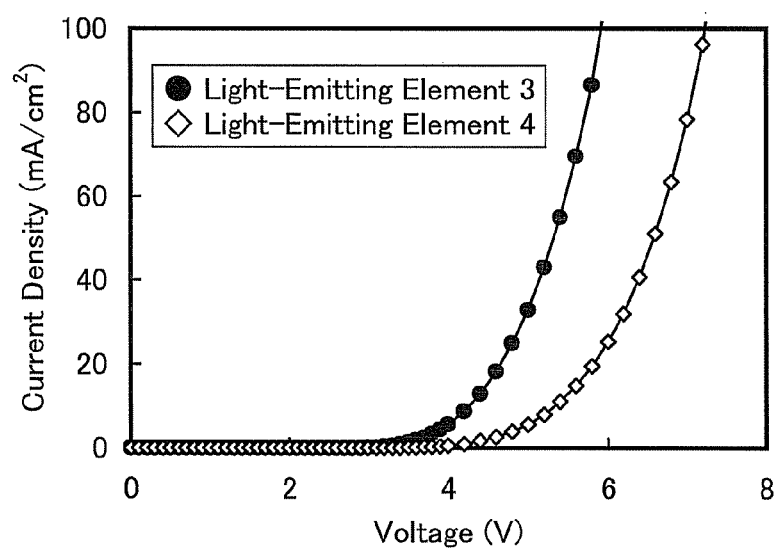
FIG. 21 is a graph showing voltage vs. current density characteristics of the light-emitting element 3 and the light-emitting element 4.

FIG. 19 is a graph showing voltage vs. luminance characteristics. FIG. 20 is a graph showing voltage vs. current density characteristics. FIG. 21 is a graph showing voltage vs. current density characteristics. From these graphs, it can be found that driving voltage of the light-emitting element 3 in which the second layer 907 that is an electron relay layer was formed is lower than that of the light-emitting element 4 in which an electron relay layer was not provided.

The structures of the second layer 907 and the first layer 908 of the light-emitting element 3 are similar to the structure of the intermediate layer 810 (the second layer 808 and the first layer 809) of the light-emitting element 1 and the light-emitting element 2. The three-layer stacked structure of the EL layer 910, the second layer 907, and the first layer 908 in the light-emitting element 3 is similar to the stacked structure of the EL layer 818, the second layer 808, and the first layer 809 in the light-emitting element 1 and the light-emitting element 2 in Example 1. Accordingly, it can be easily understood that the advantageous effect of reducing driving voltage, which is brought by formation of the second layer 808 that is an electron relay layer, also appears in the light-emitting element 1 and the light-emitting element 2.

Thus, it can be found that a structure in which a second layer is formed is extremely preferable in the light-emitting element 1 and the light-emitting element 2 in Example 1, which are light-emitting elements capable of suppressing crosstalk without great increase in voltage.

Reference Example 2

A method for synthesizing 4-phenyl-4'-(9-phenylfluoren-9-yl)triphenylamine (abbreviation: BPAFLP) used in Example 1 will be specifically described. A structure of BPAFLP is shown below.

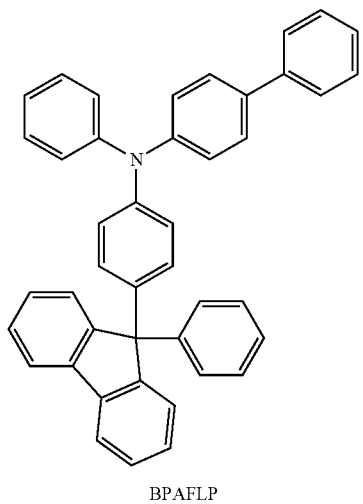 [SMILES: c1ccc(-c2ccc(N(c3ccccc3)c3ccc(C4(c5ccccc5)c5ccccc5-c5ccccc54)cc3)cc2)cc1]

BPAFLP

Step 1: Synthesis Method of 9-(4-bromophenyl)-9-phenylfluorene

In a 100-mL three-neck flask, 1.2 g (50 mmol) of magnesium was heated and stirred under reduced pressure for 30 minutes to be activated. After the flask was cooled to room temperature and is made to have a nitrogen atmosphere, several drops of dibromoethane were added, so that foam formation and heat generation were confirmed. After 12 g (50 mmol) of 2-bromobiphenyl dissolved in 10 mL of diethyl ether was slowly dripped into this mixture, the mixture was heated and stirred under reflux for 2.5 hours, whereby a Grignard reagent was prepared.

In a 500-mL three-neck flask, 10 g (40 mmol) of 4-bromobenzophenone and 100 mL of diethyl ether were put. After the Grignard reagent which was synthesized in advance was slowly dropped into this mixture, the mixture was heated and stirred under reflux for 9 hours After the reaction, this mixture was filtrated to give a residue. The obtained residue was dissolved in 150 mL of ethyl acetate, and 1N-hydrochloric acid was added to the mixture, which was then stirred for 2 hours until it was made acid. The organic layer of the liquid was washed with water. Then, magnesium sulfate was added to remove moisture. This suspension was filtered, and the obtained filtrate was concentrated to give a highly viscous substance.

In a 500-mL recovery flask were put this viscous substance, 50 mL of glacial acetic acid, and 1.0 mL of hydrochloric acid. The mixture was heated and stirred under a nitrogen atmosphere at 130° C. for 1.5 hours to be reacted.

After the reaction, this reaction mixture solution was filtrated to give a residue. The obtained residue was washed with water, a sodium hydroxide aqueous solution, water, and methanol in this order, and then dried, so that 11 g of an objective white powder was obtained at a yield of 69%. A reaction scheme of the above synthesis method is shown in the following formula.

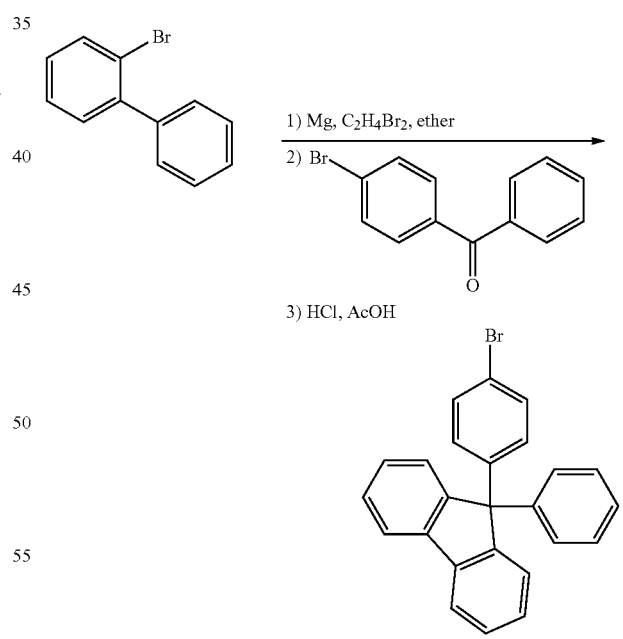

Step 2: Synthesis method of 4-phenyl-4'-(9-phenylfluoren-9-yl)triphenylamine (abbreviation: BPAFLP)

3.2 g (8.0 mmol) of 9-(4-bromophenyl)-9-phenylfluorene, 2.0 g (8.0 mmol) of 4-phenyl-diphenylamine, 1.0 g (10 mmol) of sodium tert-butoxide, and 23 mg (0.04 mmol) of bis(dibenzylideneacetone)palladium(0) were added to a 100-mL three-neck flask, and the atmosphere in the flask was substituted by nitrogen. Then, 20 mL of dehydrated xylene was added to this mixture. After the mixture was deaerated while being stirred under reduced pressure, 0.2 mL (0.1 mmol) of tri(tert-butyl) phosphine (10 wt % hexane solution) was added thereto. This mixture was heated and stirred under a nitrogen atmosphere at 110° C. for 2 hours to be reacted.

After the reaction, 200 mL of toluene was added to the reaction mixture solution, and the resulting suspension was filtrated through Florisil (produced by Wako Pure Chemical Industries, Ltd., Catalog No. 540-00135) and Celite (produced by Wako Pure Chemical Industries, Ltd., Catalog No. 531-16855). The obtained filtrate was concentrated and purified by silica gel column chromatography (developing solvent, toluene:hexane=1:4). The obtained fraction was concentrated, and acetone and methanol were added thereto. The mixture was irradiated with ultrasonic waves and then recrystallized to give 4.1 g of an objective white powder at a yield of 92%. A reaction scheme of the above synthesis method is shown in the following formula.

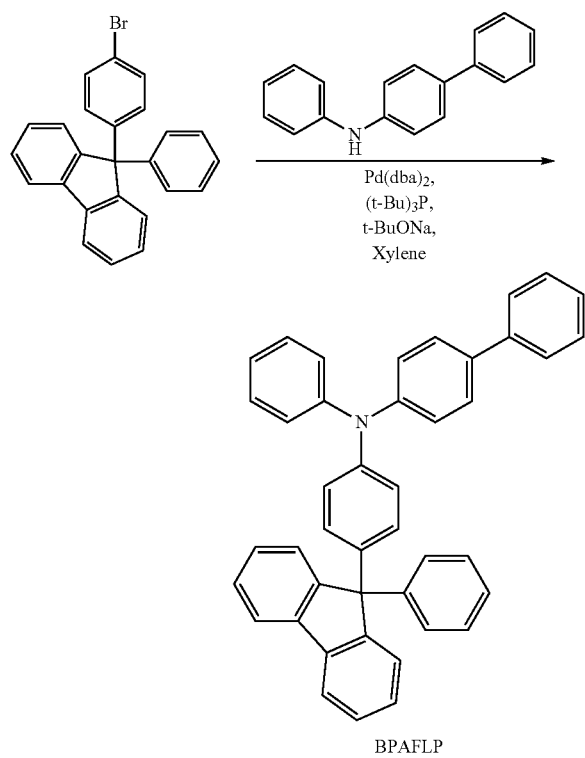

BPAFLP

An Rf value of the object by a silica gel thin layer chromatography (TLC) (developing solvent, ethyl acetate:hexane=1:10) was 0.41, that of 9-(4-bromophenyl)-9-phenylfluorene was 0.51, and that of 4-phenyl-diphenylamine was 0.27.

A compound that was obtained through the above Step 2 was subjected to a nuclear magnetic resonance (NMR) measurement. The measurement data are shown below. The measurement results indicate that the obtained compound was BPAFLP (abbreviation), which is a fluorene derivative.

$^1$H NMR (CDCl$_3$, 300 MHz): δ (ppm)=6.63-7.02 (m, 3H), 7.06-7.11 (m, 6H), 7.19-7.45 (m, 18H), 7.53-7.55 (m, 2H), 7.75 (d, J=6.9, 2H).

Reference Example 3

This reference example will give descriptions of a method for synthesizing 2-[4-(dibenzothiophen-4-yl)phenyl]-1-phenyl-1H-benzimidazole (abbreviation: DBTBIm-II) used in Example 1. A structural formula of DBTBIm-II is shown below.

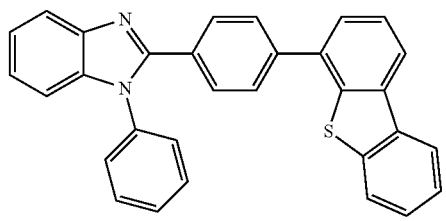 [SMILES: c1ccc(-n2c(-c3ccc(-c4cccc5c4sc4ccccc45)cc3)nc3ccccc32)cc1]

In a 500-mL three-neck flask were put 5.1 g (15 mmol) of 2-(4-bromophenyl)-1-phenyl-1H-benzimidazole, 3.7 g (16 mmol) of dibenzothiophen-4-boronic acid, and 0.2 g (0.7 mmol) of tri(ortho-tolyl)phosphine. The air in the flask was substituted by nitrogen. To this mixture were added 16 mL of a 2.0 mmol/L aqueous solution of potassium carbonate, 55 mL of toluene, and 18 mL of ethanol. Under reduced pressure, this mixture was stirred to be degassed. Then, 33 mg (0.2 mmol) of palladium(II) acetate was added to this mixture, and the mixture was stirred at 80° C. for 6 hours under a nitrogen stream.

After a certain time, water was added to the obtained mixture, and an aqueous layer was extracted with chloroform. The obtained extracted solution was washed with a saturated saline together with the organic layer and then dried over magnesium sulfate. This mixture was gravity filtered. The resulting filtrate was concentrated to give an oily substance. This oily substance was purified by silica gel column chromatography. The chromatography was carried out using toluene as a developing solvent. The obtained fraction was condensed to give a solid. Hexane was added to this solid, followed by irradiation with ultrasonic waves. Suction filtration was carried out, whereby 5.8 g of a white powder was obtained at a yield of 88%, which was the substance to be produced.

By a train sublimation method, 2.8 g of the obtained white powder was purified. In the purification, the white powder was heated at 235° C. under a pressure of 2.4 Pa with a flow rate of argon of 5 mL/min. After the purification, 2.2 g of a pale yellow glassy solid was obtained at a yield of 79%.

The synthesis scheme of the above synthesis method is shown below.

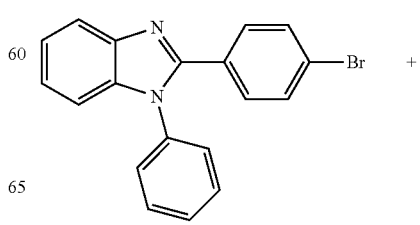

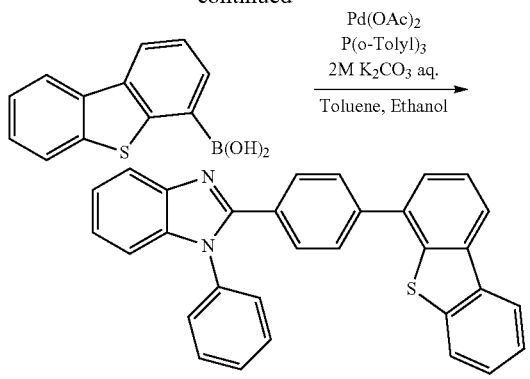

The obtained substance was measured by a nuclear magnetic resonance (NMR) method. The measurement data are shown below. From the measurement results, the obtained pale yellow glassy solid was identified as 2-[4-(dibenzothiophen-4-yl)phenyl]-1-phenyl-1H-benzimidazole (abbreviation: DBTBIm-II), which was the substance to be produced.

$^1$H NMR (CDCl$_3$, 300 MHz): δ (ppm)=7.27-7.30 (in, 2H), 7.32-7.60 (m, 10H), 7.67-7.75 (m, 4H), 7.82-7.85 (m, 1H), 7.83 (dd, J=8.4 Hz, 1.5 Hz, 1H), 8.13-8.19 (m, 2H).

EXPLANATION OF REFERENCE

1: pixel, 2: pixel, 3: pixel, 10: anode, 10-1: anode of pixel 1, 10-2: anode of pixel 2, 10-3: anode of pixel 3, 11: cathode, 12a: first EL layer, 12a-2: first EL layer, 12b: second EL layer, 12b-1: second EL layer, 12b-2: second EL layer, 12b-3: second EL layer, 13: intermediate layer, 100: anode, 101: cathode, 102: EL layer, 102k: first EL layer, 102m: m-th EL layer, 102m+1: (m+1)-th EL layer, 102n: n-th EL layer, 103: intermediate layer, 103k: first intermediate layer, 103m: m-th intermediate layer, 103n−1: (n−1)-th intermediate layer, 104: first layer, 104k: first first layer, 104m: m-th first layer, 104n−1: (n−1)-th first layer, 105: second layer, 105k: first second layer, 105m: m-th second layer, 105n−1: (n−1)-th second layer, 106: electron transport layer, 106k: first electron transport layer, 106m: m-th electron transport layer, 106n−1: (n−1)-th electron transport layer, 106n: n-th electron transport layer, 110: layer containing organic compound, 601: driver circuit portion (source line driver circuit), 602: pixel portion, 603: driver circuit portion (gate line driver circuit), 604: sealing substrate, 605: sealant, 607: space, 608: wiring, 609: FPC (flexible printed circuit), 610: element substrate, 611: switching TFT, 612: current control TFT, 613: first electrode, 614: insulator, 616: layer containing organic compound, 617: second electrode, 618: light-emitting element, 623: re-channel TFT, 624: p-channel TFT, 625: desiccant, 800: glass substrate, 801: first electrode, 802: first charge generation layer, 803: first hole transport layer, 804: first light-emitting layer, 805: second light-emitting layer, 806: first electron transport layer, 807: second electron transport layer, 808: second layer (electron relay layer), 809: first layer (second charge generation layer), 810: intermediate layer, 811: second hole transport layer, 812: third light-emitting layer, 813: fourth light-emitting layer, 814: third electron transport layer, 815: fourth electron transport layer, 816: electron injection layer, 817: second electrode, 818: EL layer, 900: glass substrate, 901: first electrode, 902: first charge generation layer, 903: hole transport layer, 904: light-emitting layer, 905: first electron transport layer, 906: second electron transport layer, 907: second layer (electron relay layer), 908: first layer (second charge generation layer), 909: second electrode, 910: EL layer, 951: substrate, 952: electrode, 953: insulating layer, 954: partition layer, 955: layer containing organic compound, 956: electrode, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024W: first electrode of light-emitting element, 1024R: first electrode of light-emitting element, 1024G: first electrode of light-emitting element, 1024B: first electrode of light-emitting element, 1025: partition wall, 1028: layer containing organic compound, 1029: second electrode of light-emitting element, 1031: sealing substrate, 1032: sealant, 1033: transparent base material, 1034R: red coloring layer, 1034G: green coloring layer, 1034B: blue coloring layer, 1035: black layer (black matrix), 1036: overcoat layer, 1037: third interlayer insulating film, 1040: pixel portion, 1041: driver circuit portion, 1042: peripheral portion, 1044W: white light-emitting region, 1044R: red light-emitting region, 1044B: blue light-emitting region, 1044G: green light-emitting region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7312: microphone, 7401: housing, 7402: display portion, 7403: operation button, 7404: external connection port, 7405: speaker, and 7406: microphone.

This application is based on Japanese Patent Application serial no. 2010-144697 filed with Japan Patent Office on Jun. 25, 2010, the entire contents of which are hereby incorporated by reference.

The invention claimed is:

1. A light-emitting device comprising:
a first light-emitting element and a second light-emitting element adjacent to the first light-emitting element, the first light-emitting element comprising:
n EL layers between an anode and a cathode, wherein n is a natural number greater than or equal to 2; and
a first layer and a second layer between an m-th EL layer and a (m+1)-th EL layer from the anode, wherein m is a natural number greater than or equal to 1 and less than or equal to n−1,
wherein the first layer is provided between and in contact with the (m+1)-th EL layer and the second layer,
wherein the second layer is provided between and in contact with the first layer and the m-th EL layer,
wherein the m-th EL layer comprises a light-emitting layer and an electron transport layer in contact with the second layer,
wherein the first layer comprises a substance having a hole transport property and an acceptor substance with respect to the substance having the hole transport property,
wherein the second layer comprises a phthalocyanine-based material,
wherein the electron transport layer comprises a substance having an electron transport property and an alkaline earth metal,
wherein in the electron transport layer, a concentration gradient of the alkaline earth metal is such that a concentration of the alkaline earth metal becomes lower from an interface with the second layer to the anode, and wherein a distance between a first light-emitting region in the first light-emitting element and a second light-emitting region in the second light-emitting element is longer than or equal to 3 μm and shorter than or equal to 5 μm.

2. The light-emitting device according to claim 1, wherein n is 2.

3. The light-emitting device according to claim 1, wherein a LUMO level of the phthalocyanine-based material is greater than or equal to −5.0 eV and less than or equal to −3.0 eV.

4. The light-emitting device according to claim 1, wherein the phthalocyanine-based material is represented by any of the following structural formulae

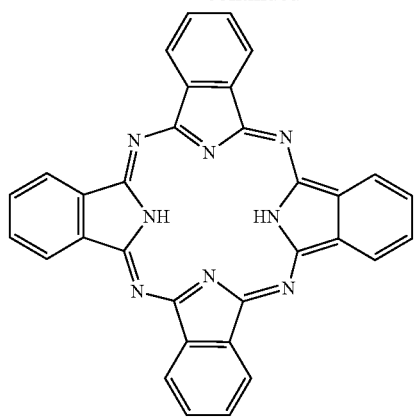

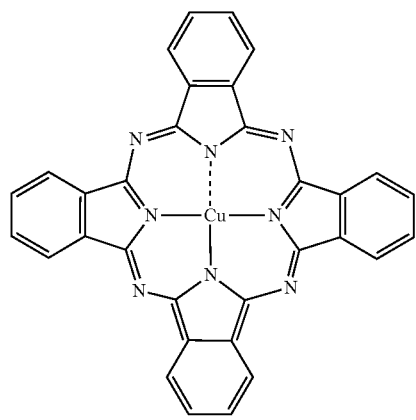

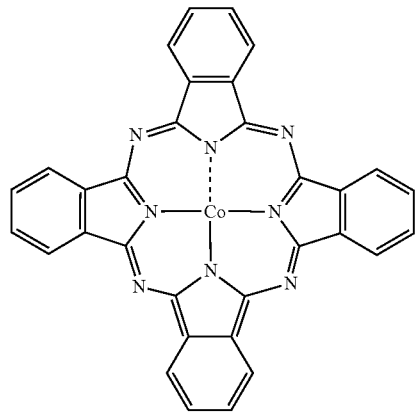

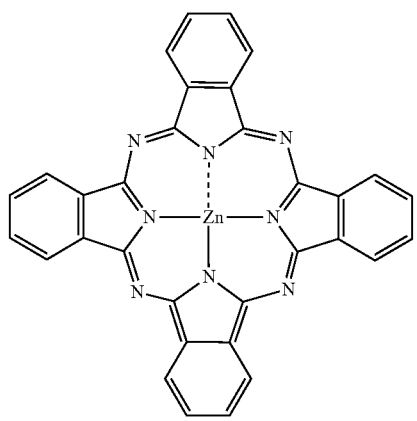

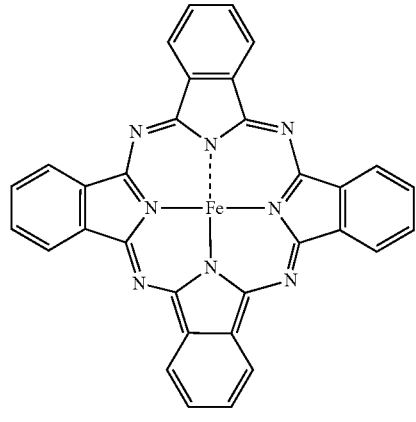

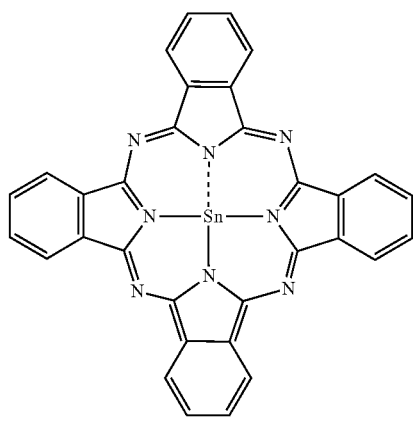

-continued

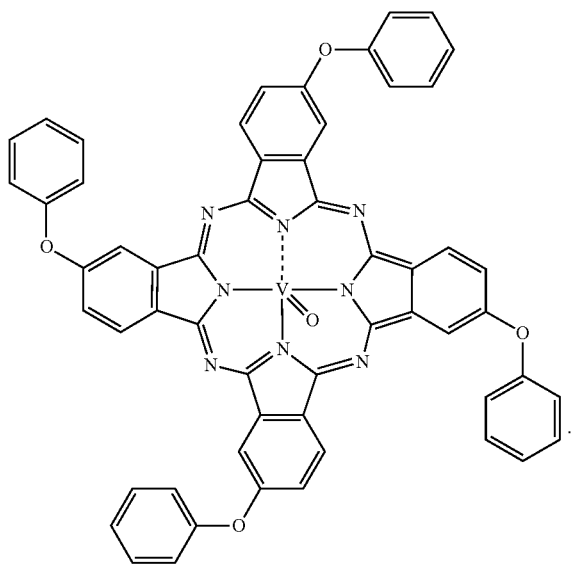

5. The light-emitting device according to claim 1, wherein the phthalocyanine-based material is represented by any of the following structural formulae

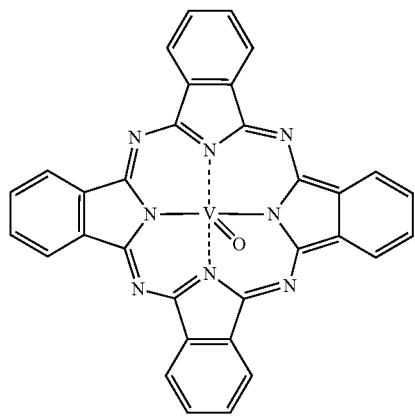

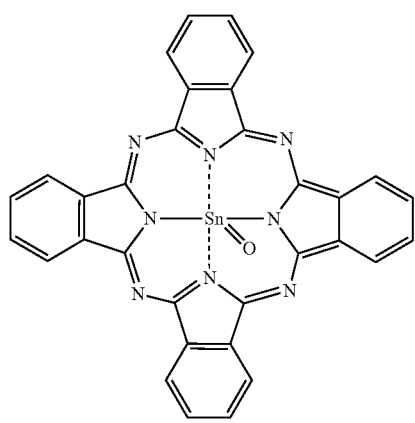

-continued

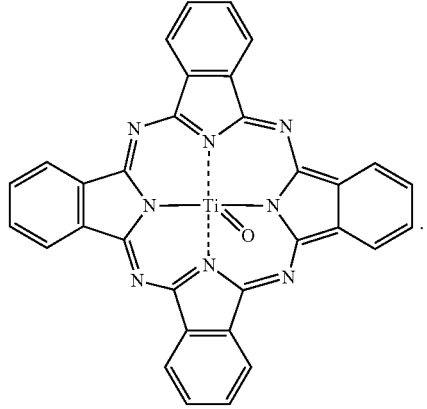

6. The light-emitting device according to claim 1, wherein the acceptor substance is an oxide of a transition metal.

7. The light-emitting device according to claim 1, wherein the acceptor substance is an oxide of a metal belonging to any of Groups 4 to 8 in the periodic table.

8. The light-emitting device according to claim 1, wherein the acceptor substance is molybdenum oxide.

9. The light-emitting device according to claim 1, wherein the first layer has a structure in which a layer comprising the substance having the hole transport property and a layer comprising the acceptor substance are stacked.

10. A display comprising the light-emitting device according to claim 1.

11. An electronic device comprising the light-emitting device according to claim 1.

12. A lighting device comprising the light-emitting device according to claim 1.

13. The light-emitting device according to claim 1, further comprising a plurality of light-emitting elements having the same structure as the first light-emitting element.

14. The light-emitting device according to claim 1,
wherein the distance between the first light-emitting region and the second light-emitting region is 4 µm.

15. The light-emitting device according to claim 1,
wherein the alkaline earth metal contained in the electron transport layer is calcium.

16. The light-emitting device according to claim 1,
wherein the concentration gradient of the alkaline earth metal is formed by forming a layer comprising the alkaline earth metal before forming the second layer, and
wherein a thickness of the layer comprising the alkaline earth metal is 1 nm.

17. A light-emitting device comprising:
a first light-emitting element and a second light-emitting element adjacent to the first light-emitting element, the first light-emitting element comprising:
n EL layers between an anode and a cathode, wherein n is a natural number greater than or equal to 2; and
a first layer and a second layer between an m-th EL layer and a (m+1)-th EL layer from the anode, wherein m is a natural number greater than or equal to 1 and less than or equal to n−1,
wherein the first layer is provided between and in contact with the (m+1)-th EL layer and the second layer, wherein the second layer is provided between and in contact with the first layer and the m-th EL layer, wherein the m-th EL layer comprises a light-emitting layer and an electron transport layer in contact with the second layer, wherein the first layer comprises a substance having a hole transport property and an acceptor substance with respect to the substance having the hole transport property, wherein the second layer comprises a phthalocyanine-based material and a donor substance with respect to the phthalocyanine-based material, wherein the electron transport layer comprises a substance having an electron transport property and an alkaline earth metal, wherein in the electron transport layer, a concentration gradient of the alkaline earth metal is such that a concentration of the alkaline earth metal becomes lower from an interface with the second layer to the anode, and wherein a distance between a first light-emitting region in the first light-emitting element and a second light-emitting region in the second light-emitting element is longer than or equal to 3 μm and shorter than or equal to 5 μm.

18. The light-emitting device according to claim 17, wherein the donor substance is at least one of an alkali metal, an alkaline earth metal, a rare earth metal, an alkali metal compound, an alkaline earth metal compound, and a rare earth metal compound.

19. The light-emitting device according to claim 17, wherein the second layer has a thickness of greater than or equal to 1 nm and less than or equal to 10 nm.

20. The light-emitting device according to claim 17, wherein a mass ratio of the donor substance to the second substance is greater than or equal to 0.001:1 and less than or equal to 0.1:1.

21. The light-emitting device according to claim 17, wherein n is 2.

22. The light-emitting device according to claim 17, wherein a LUMO level of the second substance is greater than or equal to −5.0 eV and less than or equal to −3.0 eV.

23. The light-emitting device according to claim 17, wherein the phthalocyanine-based material is represented by any of the following structural formulae

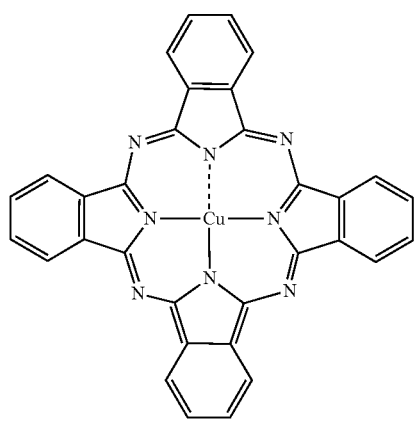

-continued

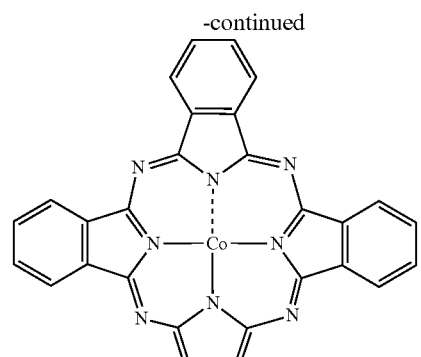

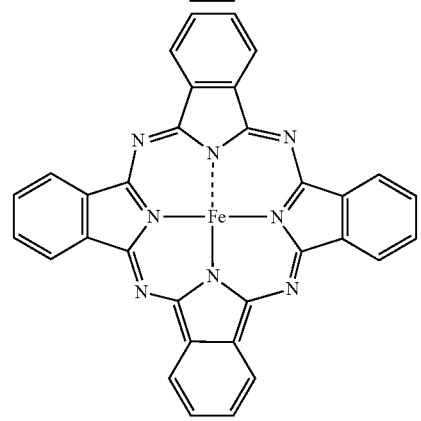

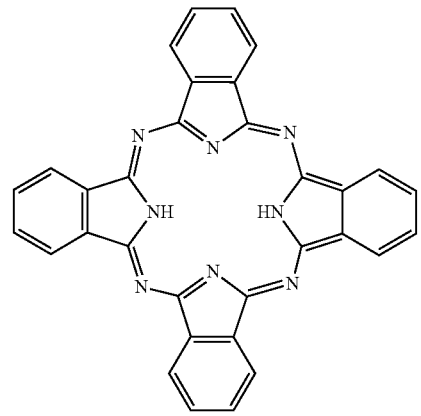

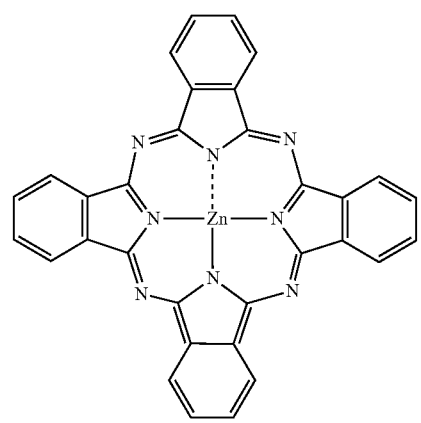

-continued

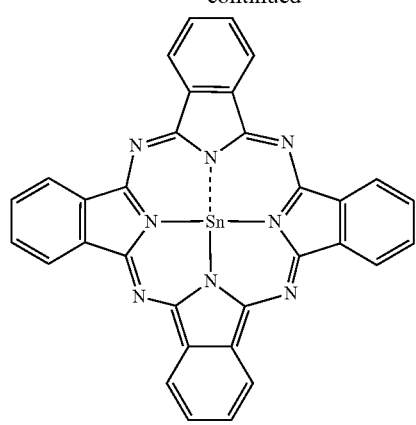

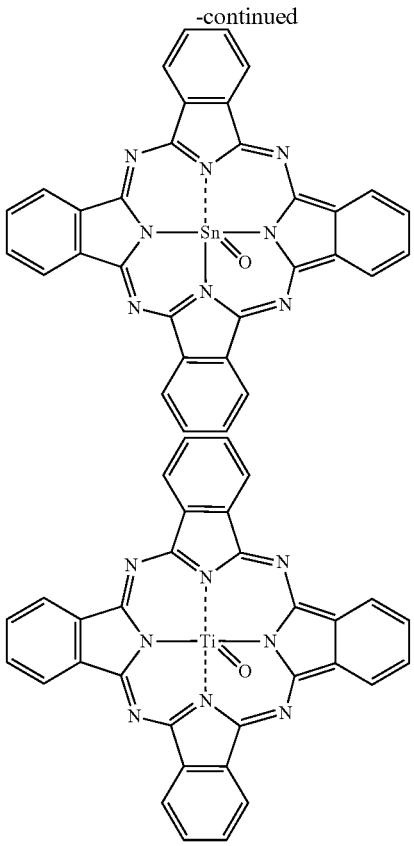

24. The light-emitting device according to claim 17, wherein the phthalocyanine-based material is represented by any of the following structural formulae

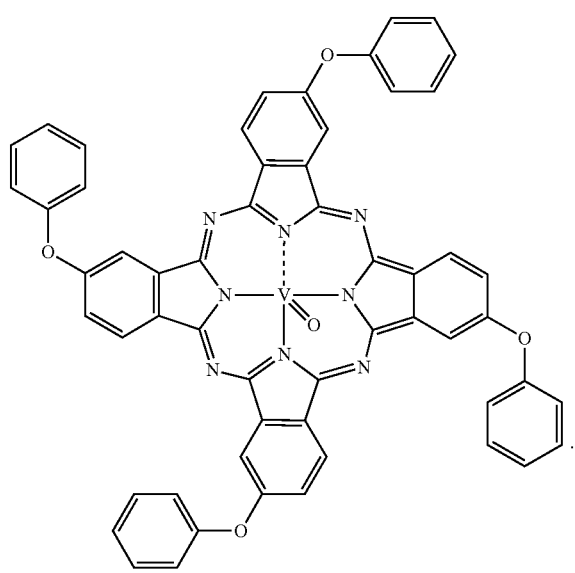

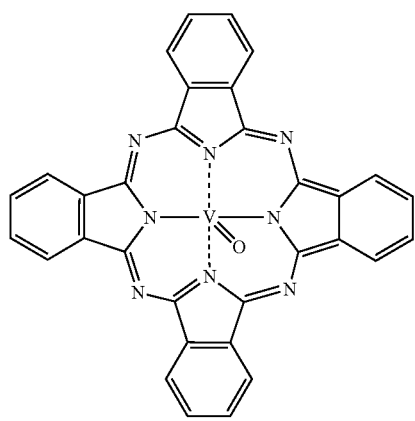

25. The light-emitting device according to claim 17, wherein the acceptor substance is an oxide of a transition metal.

26. The light-emitting device according to claim 17, wherein the acceptor substance is an oxide of a metal belonging to any of Groups 4 to 8 in the periodic table.

27. The light-emitting device according to claim 17, wherein the acceptor substance is molybdenum oxide.

28. The light-emitting device according to claim 17, wherein the first layer has a structure in which a layer comprising the substance having the hole transport property and a layer comprising the acceptor substance are stacked.

29. A display comprising the light-emitting device according to claim 17.

30. An electronic device comprising the light-emitting device according to claim 17.

31. A lighting device comprising the light-emitting device according to claim 17.

32. The light-emitting device according to claim 17, further comprising a plurality of light-emitting elements having the same structure as the first light-emitting element.

33. The light-emitting device according to claim 17, wherein the distance between the first light-emitting region and the second light-emitting region is 4 µm.

34. The light-emitting device according to claim 17, wherein the alkaline earth metal contained in the electron transport layer is calcium.

35. The light-emitting device according to claim 17, wherein the concentration gradient of the alkaline earth metal is formed by forming a layer comprising the alkaline earth metal before forming the second layer, and wherein a thickness of the layer comprising the alkaline earth metal is 1 nm.

* * * * *

UNITED STATES PATENT AND TRADEMARK OFFICE
CERTIFICATE OF CORRECTION

PATENT NO. : 8,993,126 B2  
APPLICATION NO. : 13/166398  
DATED : March 31, 2015  
INVENTOR(S) : Hiromi Nowatari et al.

Page 1 of 1

It is certified that error appears in the above-identified patent and that said Letters Patent is hereby corrected as shown below:

In the Specification:

Column 9, Line 63; Change "an nigh EL" to --an m-th EL--.

Column 10, Line 16; Change "(in is" to --(m is--.

Column 21, Line 20; Change "]-N,N-" to --]-N,N'--.

Column 21, Line 30; Change "[N,N',N"-" to --[N,N',N'- --.

Column 21, Line 34; Change "]-N,N',N"-" to --]-N,N',N'- --.

Column 37, Line 11; Change "30 mm Here," to --30 nm. Here,--.

Column 38, Line 16; Change "14Q" to --14G,--.

Column 38, Line 24; Change "15Q" to --15G,--.

Column 38, Line 45; Change "16Q" to --16G,--.

Column 47, Line 25; Change "(in, 2H)," to --(m, 2H),--.

Column 47, Line 54; Change "re-channel" to --n-channel--.

Signed and Sealed this  
Twentieth Day of October, 2015

Michelle K. Lee  
*Director of the United States Patent and Trademark Office*